US012154955B2

(12) United States Patent
Yilmaz et al.

(10) Patent No.: US 12,154,955 B2
(45) Date of Patent: *Nov. 26, 2024

(54) HIGH VOLTAGE EDGE TERMINATION STRUCTURE FOR POWER SEMICONDUCTOR DEVICES AND MANUFACTURING METHOD THEREOF

(71) Applicants: TAIWAN SEMICONDUCTOR CO., LTD., New Taipei (TW); Hamza Yilmaz, Gilory, CA (US)

(72) Inventors: Hamza Yilmaz, Gilory, CA (US); Aryadeep Mrinal, New Taipei (TW)

(73) Assignees: TAIWAN SEMICONDUCTOR CO., LTD., New Taipei (TW); Hamza Yilmaz, Gilory, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/077,670

(22) Filed: Dec. 8, 2022

(65) Prior Publication Data

US 2023/0108668 A1    Apr. 6, 2023

Related U.S. Application Data

(62) Division of application No. 16/950,586, filed on Nov. 17, 2020.

(51) Int. Cl.
*H01L 29/40* (2006.01)
*H01L 21/265* (2006.01)
*H01L 29/06* (2006.01)

(52) U.S. Cl.
CPC .......... *H01L 29/404* (2013.01); *H01L 21/265* (2013.01); *H01L 29/0638* (2013.01)

(58) Field of Classification Search
CPC . H01L 29/404; H01L 21/265; H01L 29/0638; H01L 29/66128; H01L 29/0619; H01L 29/0615; H01L 29/8611
USPC ........................................................ 257/490
See application file for complete search history.

(56) References Cited

U.S. PATENT DOCUMENTS

| 4,667,393 | A  | 5/1987 | Ferla et al. |
| 6,445,054 | B1 | 9/2002 | Traijkovic et al. |
| 8,749,017 | B2 | 6/2014 | Lu |
| 9,035,415 | B2 | 5/2015 | Senoo |

(Continued)

FOREIGN PATENT DOCUMENTS

| CN | 102214678 A | * 10/2011 |
| CN | 102005468 B |   9/2012 |

(Continued)

*Primary Examiner* — Mohammad M Hoque
(74) *Attorney, Agent, or Firm* — Li & Cai Intellectual Property (USA) Office

(57) ABSTRACT

A high voltage edge termination structure for a power semiconductor device is provided. The high voltage edge termination structure comprises a semiconductor body of a first conductive type, a JTE region of a second conductive type, a heavily doped channel stop region of the first conductive type, and a plurality of field plates. The JTE region is formed in the semiconductor body, wherein the JTE region is adjacent to an active region of the power semiconductor device. The heavily doped channel stop region is formed in the semiconductor body, wherein the heavily doped channel stop region is spaced apart from the JTE region. The plurality of field plates is formed on the JTE region.

4 Claims, 19 Drawing Sheets

(56) References Cited

U.S. PATENT DOCUMENTS

| | | |
|---|---|---|
| 9,240,444 B2 | 1/2016 | Siddiqui |
| 9,257,541 B2 | 2/2016 | Otsuki et al. |
| 9,478,605 B2 | 10/2016 | Mochizuki et al. |
| 2003/0067033 A1* | 4/2003 | Kinoshita ............ H01L 29/0619 257/E29.104 |
| 2006/0065899 A1* | 3/2006 | Hatakeyama ....... H01L 29/7395 257/E29.198 |
| 2007/0080422 A1 | 4/2007 | Falck et al. |
| 2007/0246791 A1 | 10/2007 | Schulze et al. |
| 2011/0233714 A1* | 9/2011 | Lu ..................... H01L 29/66348 257/493 |
| 2012/0313212 A1 | 12/2012 | Sugawara |
| 2013/0320462 A1 | 12/2013 | Tipirneni et al. |
| 2014/0091359 A1* | 4/2014 | Otsuki ................ H01L 29/0638 257/140 |
| 2014/0145289 A1* | 5/2014 | Zhang .................... H01L 29/47 257/475 |
| 2016/0049463 A1* | 2/2016 | Buchholz ............ H01L 29/0638 257/493 |
| 2016/0218187 A1 | 7/2016 | Mochizuki et al. |
| 2016/0254357 A1* | 9/2016 | Aketa .................... H01L 29/167 257/77 |
| 2016/0315187 A1 | 10/2016 | Kinoshita et al. |
| 2018/0114841 A1 | 4/2018 | Falck et al. |
| 2019/0140095 A1* | 5/2019 | Okumura ............ H01L 29/0878 |
| 2019/0259873 A1 | 8/2019 | Yamanobe et al. |
| 2020/0006494 A1 | 1/2020 | Tsuji et al. |
| 2020/0266269 A1 | 8/2020 | Brandt et al. |
| 2021/0226031 A1 | 7/2021 | Kojima et al. |
| 2021/0273117 A1 | 9/2021 | Hoshi |
| 2022/0102486 A1 | 3/2022 | Esteve et al. |
| 2022/0140113 A1* | 5/2022 | Wakimoto ............ H01L 29/401 438/270 |
| 2022/0190114 A1 | 6/2022 | Tawara et al. |

FOREIGN PATENT DOCUMENTS

| | | | |
|---|---|---|---|
| CN | 102005498 B | 9/2012 | |
| CN | 111293166 A * | 6/2020 | ............ H01L 21/822 |
| FR | 2958452 A1 * | 10/2011 | ......... H01L 29/0615 |
| GB | 2596296 A | 12/2021 | |
| JP | H1074959 A * | 3/1998 | |
| JP | 201625300 A | 2/2016 | |

* cited by examiner

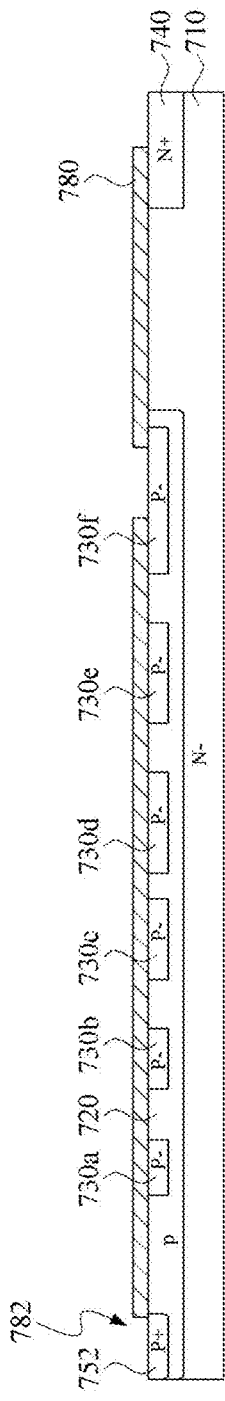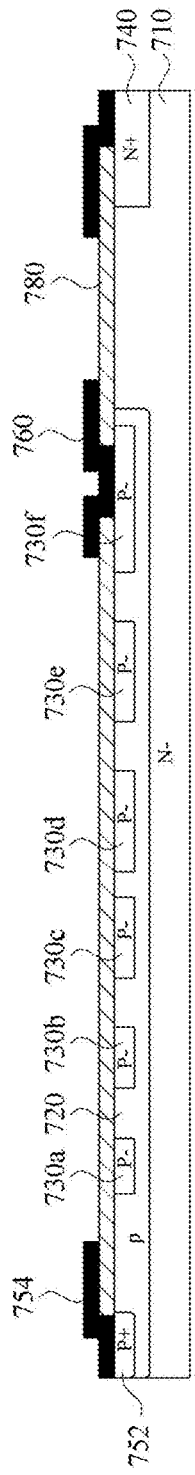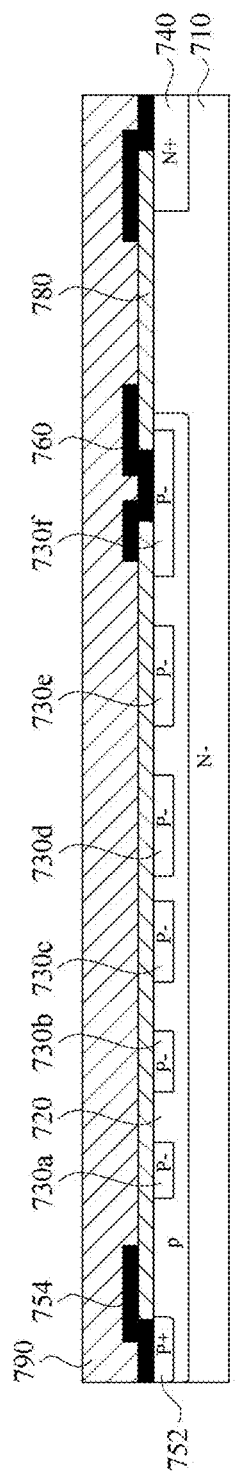

HIGH VOLTAGE EDGE TERMINATION STRUCTURE FOR POWER SEMICONDUCTOR DEVICES AND MANUFACTURING METHOD THEREOF

CROSS-REFERENCE TO RELATED PATENT APPLICATION

This application is a divisional application of Ser. No. 16/950,586 filed on Nov. 17, 2020, and entitled "HIGH VOLTAGE EDGE TERMINATION STRUCTURE FOR POWER SEMICONDUCTOR DEVICES AND MANUFACTURING METHOD THEREOF", now pending, the entire disclosures of which are incorporated herein by reference.

FIELD OF THE DISCLOSURE

The present invention relates to semiconductor devices, and more particularly to high voltage edge termination structures for power semiconductor devices and manufacturing method thereof.

BACKGROUND OF THE DISCLOSURE

Reliable power semiconductor devices require high voltage edge termination structures. The high voltage edge termination structures nowadays are presented in various forms, including field plate, floating guard ring, junction termination extension (JTE), as well as combinations of floating guard ring with field plate structures. Additionally, there are combinations of these basic termination techniques applied to the latest wide bandgap semiconductors, such as the variably laterally doped zone with decreasing concentration termination disclosed in U.S. Pat. No. 8,564,088B2, the double guard ring edge termination for SiC disclosed in U.S. Pat. No. 9,640,609B2.

The selection of high voltage edge termination structures is dependent on the required blocking voltage. Existing data indicates that the power devices of 100V and below prefer to use field plate type termination structure; the power devices up to 1200V mostly utilize floating guard ring with field plate type termination structures as shown in FIG. 1A; and anything above 1200V, such as power diode, metal oxide semiconductor field effect transistors (MOSFET), insulated gate bipolar transistor (IGBT), and thyristor type devices, prefers to utilize JTE type structure and a combination of JTE, floating guard ring, and field plate type structures. For even higher voltages, such as 5000V and above, beveled type termination structures are used. FIG. 1A is a schematic illustration showing a conventional high voltage edge termination structure with field plates and floating guard rings.

The three critical concerns for implementing high voltage edge termination structure include: (1) the process steps required to implement the high voltage edge termination structure; (2) the area required for implement the high voltage edge termination structure; and (3) the reliability by being tolerant to the surface charge (Qss) variations. By and large, when surface charge varies (mainly when positive charge fluctuates), the surface charge in the termination region impacts the depletion region for the given reverse bias voltage. For instance, if the surface charge is high, the depletion width in the termination region shrinks, which may result in an increase of the electric field to critical values thereby causing the breakdown of the device at lower applied voltage.

Among the various conventional high voltage edge termination structures, the JTE type high voltage edge termination structure will demand the smallest area for implementation. However, JTE structures are markedly sensitive to surface charge variations. To improve surface charge tolerance of JTE structure, Temple and colleagues have proposed a multi-zone junction termination extension (MZ-JTE) structure as shown in FIG. 1B. However, the MZ-JTE structure requires a larger or supplemental area for implementation.

SUMMARY OF THE DISCLOSURE

It is an object of the present invention to provide a high voltage edge termination structure to increase tolerance to surface charge with minimal increase in area to implement new HV termination structures.

Some embodiments of the present invention provide a high voltage edge termination structure for a power semiconductor device. The high voltage edge termination structure comprises a semiconductor body of a first conductive type, a JTE region of a second conductive type, a heavily doped channel stop region of the first conductive type, and a plurality of field plates. The JTE region is formed in the semiconductor body, wherein the JTE region is adjacent to an active region of the power semiconductor device. The heavily doped channel stop region is formed in the semiconductor body, wherein the heavily doped channel stop region is spaced apart from the JTE region. The plurality of field plates is formed on the JTE region.

In some embodiments of the present invention, the first conductivity type is N-type, and the second conductivity type is P-type.

In some embodiments of the present invention, the field plates are made of a metal material.

In some embodiments of the present invention, the field plates are made of P-type poly silicon.

In some embodiments of the present invention, the field plates are made of N-type poly silicon.

Some embodiments of the present invention provide a high voltage edge termination structure for a power semiconductor device. The high voltage edge termination structure comprises a semiconductor body of a first conductive type, a JTE region of a second conductive type, a heavily doped channel stop region of the first conductive type, and a plurality of depletable guard rings of the second conductive type. The JTE region is formed in the semiconductor body, wherein the JTE region is adjacent to an active region of the power semiconductor device. The heavily doped channel stop region is formed in the semiconductor body, wherein the heavily doped channel stop region is spaced apart from the JTE region. The plurality of depletable guard rings of the second conductive type is formed in the semiconductor body, wherein the depletable guard rings are formed between the JTE region and the heavily doped channel stop region.

In some embodiments of the present invention, the first conductivity type is N-type, and the second conductivity type is P-type.

Some embodiments of the present invention provide a high voltage edge termination structure for a power semiconductor device. The high voltage edge termination structure comprises a semiconductor body of a first conductive type, a JTE region of a second conductive type, a plurality of lightly doped regions of the second conductive type, and a heavily doped channel stop region of the first conductive type. The JTE region is formed in the semiconductor body, wherein the JTE region is adjacent to an active region of the power semiconductor device. The plurality of lightly doped regions is formed in the JTE region adjacent to an upper surface of the JTE region. The heavily doped channel stop region is formed in the semiconductor body, wherein the heavily doped channel stop region is spaced apart from the JTE region.

In some embodiments of the present invention, the first conductivity type is N-type, and the second conductivity type is P-type.

In some embodiments of the present invention, a lateral width of the lightly doped regions becomes larger along a direction toward the heavily doped channel stop region.

In some embodiments of the present invention, a space between the lightly doped region in a vicinity of the active region and the active region is greater than a space between the neighboring lightly doped regions.

In some embodiments of the present invention, the high voltage edge termination structure further comprises a plurality of field plates, formed on the JTE region. In further embodiment of the present invention, the field plates are made of a metal material. In further embodiment of the present invention, the field plates are made of P-type poly silicon. In further embodiment of the present invention, the field plates are made of N-type poly silicon.

Some embodiments of the present invention provide a high voltage edge termination structure for a power semiconductor device. The high voltage edge termination structure comprises a semiconductor body of a first conductive type, a JTE region of a second conductive type, a heavily doped channel stop region of the first conductive type, a plurality of depletable guard rings of the second conductive type, and a plurality of lightly doped regions of the second conductive type. The JTE region is formed in the semiconductor body, wherein the JTE region is adjacent to an active region of the power semiconductor device. The heavily doped channel stop region is formed in the semiconductor body, wherein the heavily doped channel stop region is spaced apart from the JTE region. The plurality of depletable guard rings is formed in the semiconductor body, wherein the depletable guard rings are formed between the JTE region and the heavily doped channel stop region. The plurality of lightly doped regions is formed in an upper portion of the JTE region and at least one of the depletable guard rings.

In some embodiments of the present invention, the first conductivity type is N-type, and the second conductivity type is P-type.

In some embodiments of the present invention, a lateral width of the lightly doped regions becomes larger along a direction toward the heavily doped channel stop region.

In some embodiments of the present invention, a space between the lightly doped region in a vicinity of the active region and the active region is greater than a space between the neighboring lightly doped regions.

In some embodiments of the present invention, a gap between the depletable guard rings increases along a direction toward the heavily doped channel stop region.

In some embodiments of the present invention, the high voltage edge termination structure further comprises a plurality of field plates, formed on the JTE region. In further embodiments of the present invention, the field plates are made of a metal material. In further embodiments of the present invention, the field plates are made of P-type poly silicon. In further embodiments of the present invention, the field plates are made of N-type poly silicon.

Some embodiments of the present invention provide a method of manufacturing a high voltage edge termination structure for a power semiconductor device. The method comprises; forming a heavily doped channel stop region of the first conductive type in a semiconductor body of the first conductive type by ion implantation of the first conductive type; forming a JTE region of a second conductive type in the semiconductor body by ion implantation of the second conductive type, wherein the JTE region is adjacent to an active region of the power semiconductor device and is spaced apart from the heavily doped channel stop region; and forming a plurality of field plates on the JTE region.

Some embodiments of the present invention provide a method of manufacturing a high voltage edge termination structure for a power semiconductor device. The method comprises: forming a heavily doped channel stop region of the first conductive type in a semiconductor body of the first conductive type by ion implantation of the first conductive type; forming a JTE region of a second conductive type in the semiconductor body by ion implantation of the second conductive type, wherein the JTE region is adjacent to an active region of the power semiconductor device and is spaced apart from the heavily doped channel stop region; and forming a plurality of depletable guard rings of the second conductive type in the semiconductor body by ion implantation of the second conductive type, wherein the depletable guard rings are formed between the JTE region and the heavily doped channel stop region.

In some embodiment of the present invention, the JTE region and the depletable guard rings are simultaneously formed in the semiconductor body.

Some embodiments of the present invention provide a method of manufacturing a high voltage edge termination structure for a power semiconductor device. The method comprises: forming a heavily doped channel stop region of the first conductive type in a semiconductor body of the first conductive type by ion implantation of the first conductive type; forming a JTE region of a second conductive type in the semiconductor body by ion implantation of the second conductive type, wherein the JTE region is adjacent to an active region of the power semiconductor device and is spaced apart from the heavily doped channel stop region; and forming a plurality of lightly doped regions of the second conductive type in the JTE region adjacent to an upper surface of the JTE region by ion implantation of the first conductive type.

In some embodiment of the present invention, the method further comprises forming a plurality of field plates on the JTE region.

Some embodiments of the present invention provide a method of manufacturing a high voltage edge termination structure for a power semiconductor device. The method comprises: forming a heavily doped channel stop region of the first conductive type in a semiconductor body of the first conductive type by ion implantation of the first conductive type; forming a JTE region of a second conductive type and a plurality of depletable guard rings of the second conductive type in the semiconductor body by ion implantation of the second conductive type, wherein the JTE region is adjacent to an active region of the power semiconductor device and is spaced apart from the heavily doped channel stop region, and the depletable guard rings are formed between the JTE region and the heavily doped channel stop region; and forming a plurality of lightly doped regions of the second conductive type in the JTE region and the depletable guard rings adjacent to an upper surface of the JTE region by ion implantation of the first conductive type.

In some embodiments of the present invention, the method further comprises forming a plurality of field plates on the JTE region.

Advantages and/or features of the invention, and the manner in which the same are accomplished, will become more readily apparent upon consideration of the following detailed description of the invention taken in conjunction with the accompanying drawings, which illustrate preferred and exemplary embodiments.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIGS. 8A to 8G are schematic illustration showing a manufacturing process of a high voltage edge termination structure featuring a laterally modulated JTE structure provided in accordance with an embodiment of the present invention.

DETAILED DESCRIPTION OF THE EXEMPLARY EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. In the following discussion, an N-type device is described for purposes of illustration. P-type devices may be fabricated using a similar process but with opposite conductivity types.

As is noted that the surface charges (Qss) in the termination region may impact the depletion region for the given reverse bias voltage. To resolve the aforementioned problem, the high voltage edge termination structures in according to the embodiments of the present invention are provided to minimize shrinkage of depletion spread and lower peak electric field variations at the termination region for low and high surface charge cases so as to improve tolerance to surface charge variations.

Please referring to FIG. 2, a high voltage edge termination structure featuring a laterally modulated JTE structure provided in accordance with a first embodiment of the present invention will be discussed.

Figure 2:
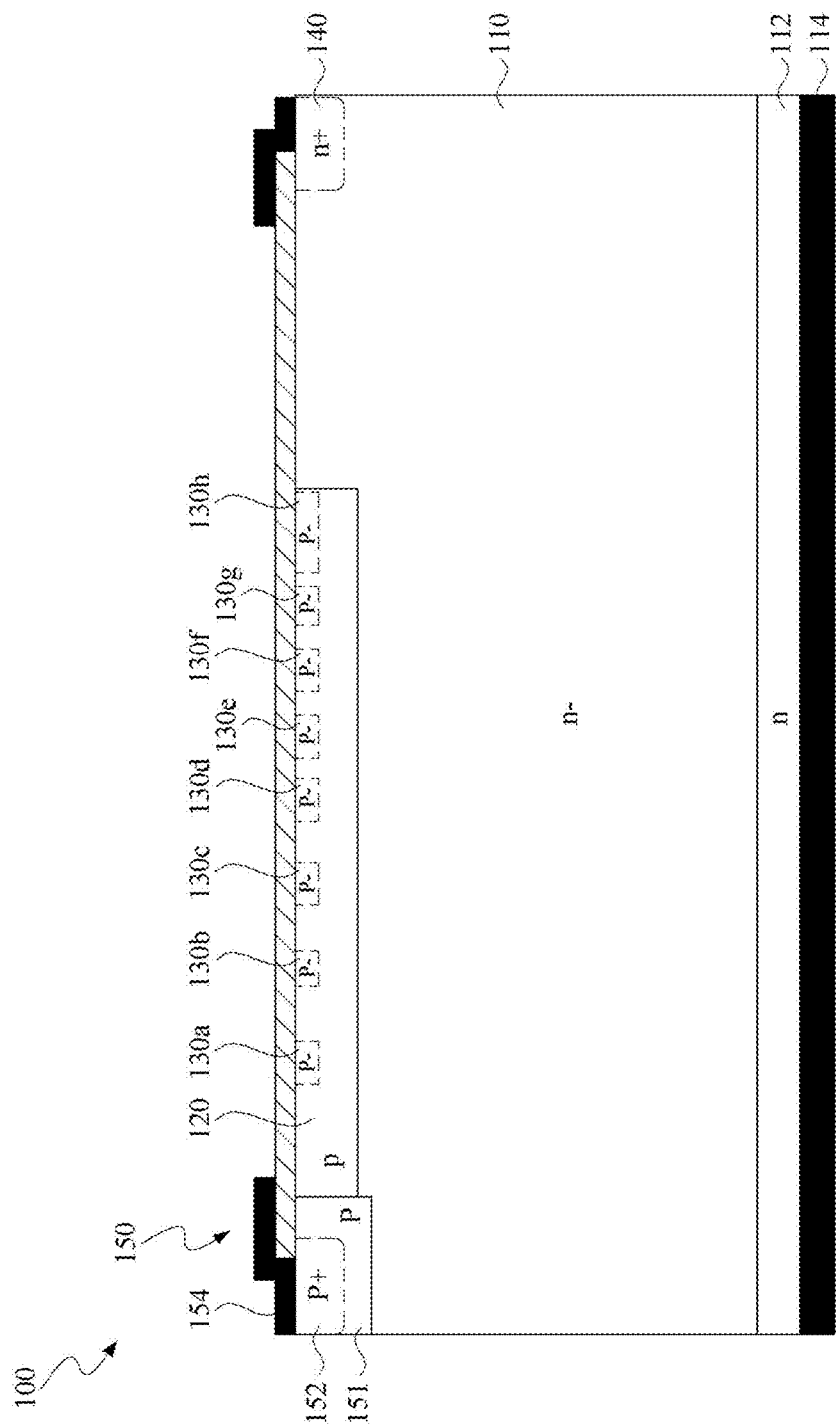
FIG. 2 is a schematic illustration showing a high voltage edge termination structure featuring a laterally modulated JTE structure provided in accordance with a first embodiment of the present invention.

As illustrated in FIG. 2, the high voltage edge termination structure 100 comprises an N-type semiconductor body 110, a P-type JTE region 120, a plurality of P-type lightly doped regions 130a~130h, and an N-type heavily doped channel stop region 140.

There is an N-type semiconductor layer 112 with a doping concentration higher than that of the N-type semiconductor body 110 formed on a lower surface of the N-type semiconductor body 110. The N-type semiconductor layer 112 is utilized for reducing contact resistance between the N-type semiconductor body 110 and a cathode electrode 114 of the power semiconductor device.

The P-type JTE region 120 is formed in the top portion of the N-type semiconductor body 110. The P-type JTE region 120 is adjacent to the active region 150 of the power semiconductor device and is extended from the active region 150 toward the edge. To be more precisely, the P-type JTE region 120 is extended from the P-type well 151 of the active region 150 toward the edge of the power semiconductor device. The P-type well 151 is electrically connected to the anode electrode 154 through a P-type heavily doped region 152.

In accordance with an embodiment of the present invention, the P-type JTE region 120 may have a constant depth, and the depth of the P-type JTE region 120 may be equal to or greater than the depth of the P-type well 151.

The P-type lightly doped regions 130a~130h are formed in the upper portion of the P-type JTE region 120, i.e. the portion close to the upper surface of the P-type JTE region 120. These P-type lightly doped regions 130a~130h are spaced apart from each other.

The N-type heavily doped channel stop region 140 is formed in the top portion of the N-type semiconductor body 110. The N-type heavily doped channel stop region 140 is located outside the P-type JTE region 120 utilized for limiting the depletion region at the outer edge of the semiconductor device when the power semiconductor device is reverse-biased. In the present embodiment, a metal layer is formed on the N-type heavily doped channel stop region 140. However, the metal layer on the N-type heavily doped channel stop region 140 may be skipped in some embodiments.

The P-type JTE region 120 and the plurality of P-type lightly doped regions 130a-130h therein form a P-type laterally modulated JTE region. The N-type heavily doped channel stop region 140 is spaced apart from the P-type JTE region 120 by an N-type region, i.e. the surface portion of the N-type semiconductor body 110. That is, a lateral termination structure with the P-type laterally modulated JTE region, the N-type region, and the N-type heavily doped channel stop region 140 extended from the active region 150 to the edge is formed. The P-type laterally modulated JTE region shows the structure featuring the alternatively arranged P and P– regions close to the upper surface of the semiconductor body.

The P-type laterally modulated JTE region featuring a P-type JTE region with a uniform depth and multiple alternatively arranged P and P– regions in the upper portion thereof for spreading depletion. Thus, the P-type laterally modulated JTE region may control the peak surface electric field without too much compromising the breakdown voltage. That is, the P-type laterally modulated JTE region may minimize the reduction of the reverse bias breakdown voltage due to surface charge variations.

The number, the lateral width, and the spacing of these P-type lightly doped regions 130a~130h in the P-type JTE region 120 may be adjustable to optimize the trade-off between blocking capability and surface charge tolerance. As is further illustrated in FIG. 2, in accordance with a preferred embodiment of the present invention, a lateral width of the P-type lightly doped regions 130a~130h becomes larger along a direction toward the N-type heavily doped channel stop region 140, and a space between the P-type lightly doped region 130a in a vicinity of the active region 150 and the active region 150 is greater than a space between the neighboring P-type lightly doped regions 130b~130h. With the doping modulation in the P-type JTE region 120, a shrink in the depletion expansion toward the N-type heavily doped channel stop region 140 will prompt depletion to expand deeper in the P-type JTE region 120 toward the active region 150. Embodiments of the present invention are not limited to the present configuration. The variation of the lateral width of the lightly doped regions 130a~130h as well as the arrangement of the lightly doped regions 130a~130h in the JTE region 120 may be adjusted according to the actual condition and should not be deemed as departing from the scope of the present invention.

Figure 2A:
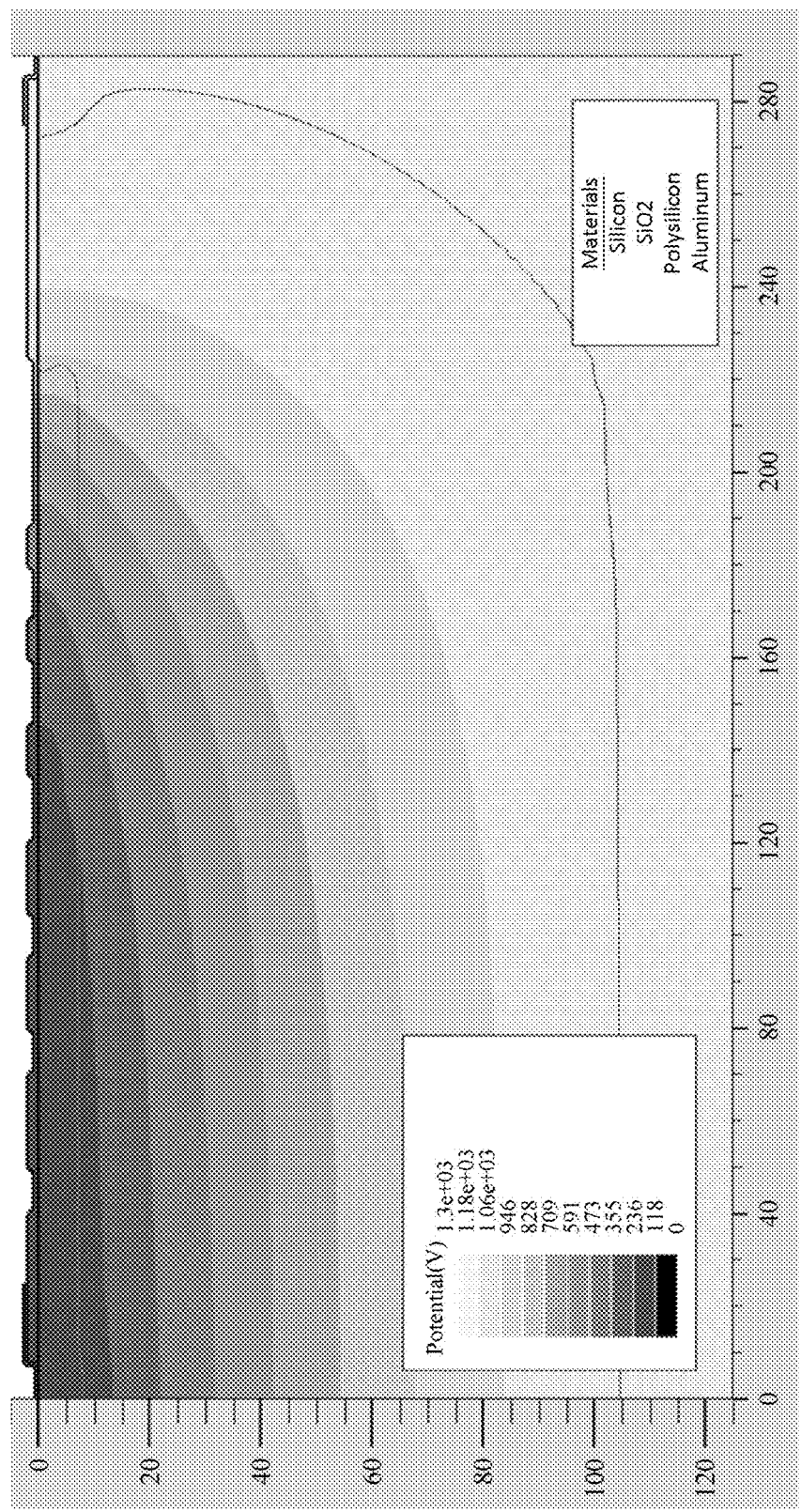
FIG. 2A is a simulated structure showing a potential distribution contour of a silicon based high voltage edge termination structure featuring a laterally modulated JTE structure at 1300V bias with surface charge of $5e^{10}$ $Cm^{-2}$.
Figure 2B:
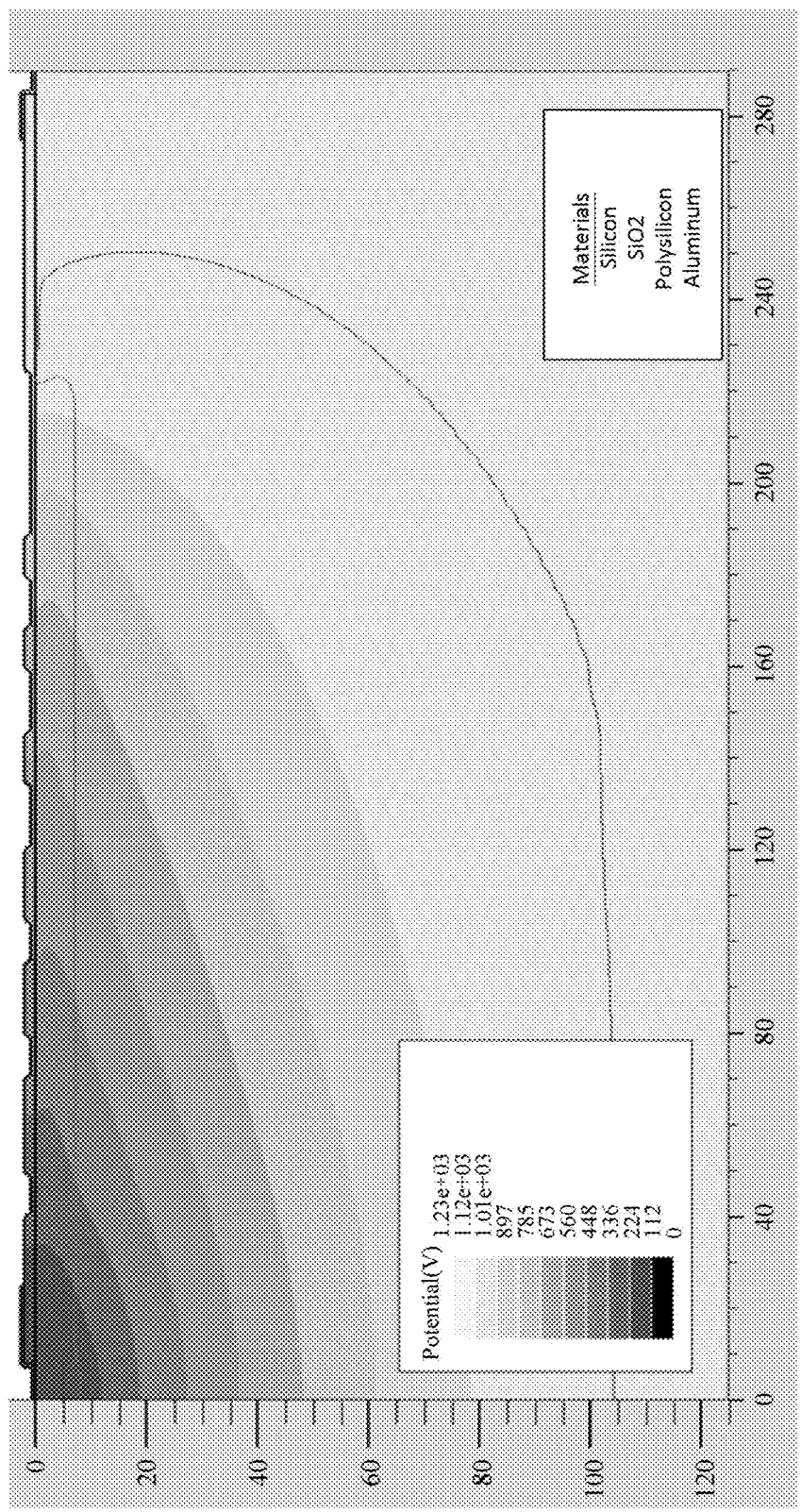
FIG. 2B is a simulated structure showing a potential distribution contour of a silicon based high voltage edge termination structure featuring a laterally modulated JTE structure at 1250V bias with surface charge of $5e^{11}$ $Cm^{-2}$.
Figure 2C:
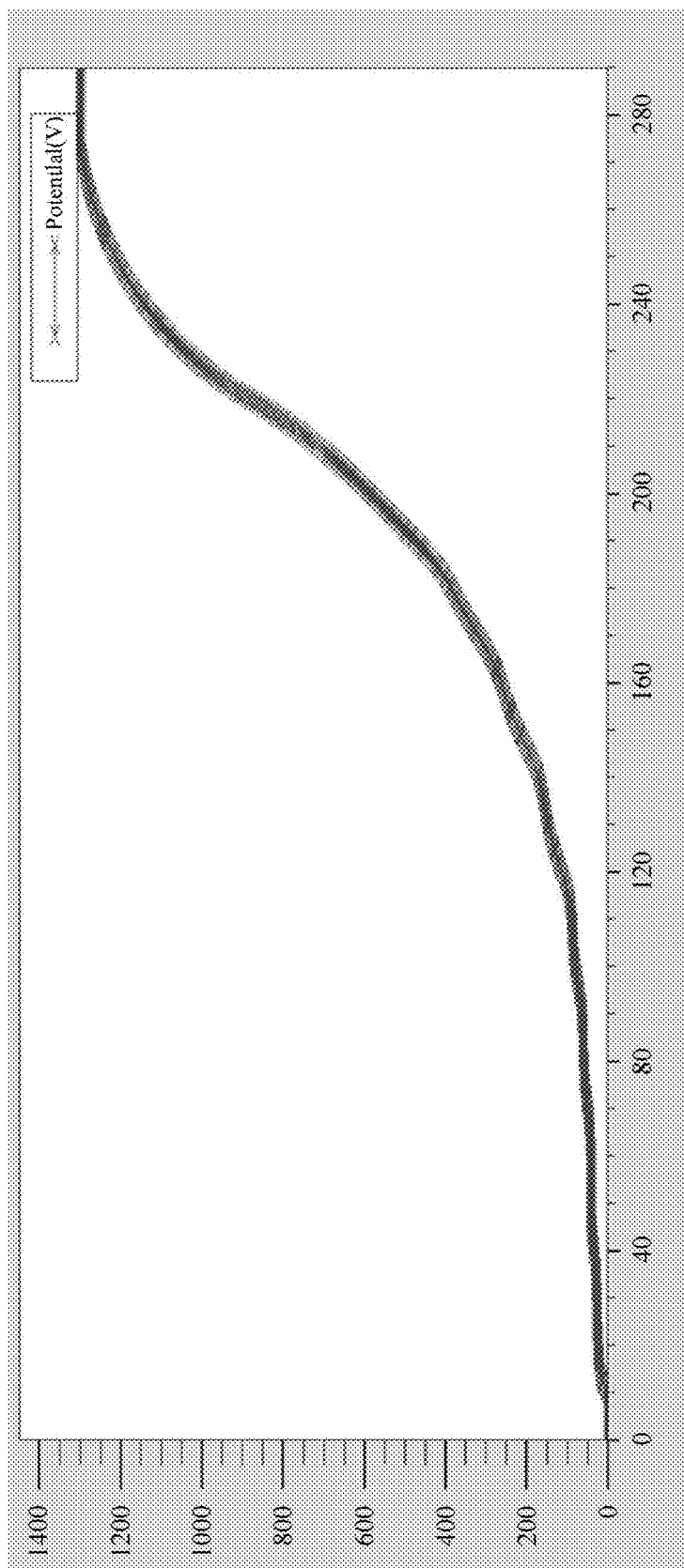
FIG. 2C is a graph showing a surface potential of a silicon based high voltage edge termination structure featuring a laterally modulated JTE structure at 1300V bias with surface charge of $5e^{10}$ $Cm^{-2}$.
Figure 2D:
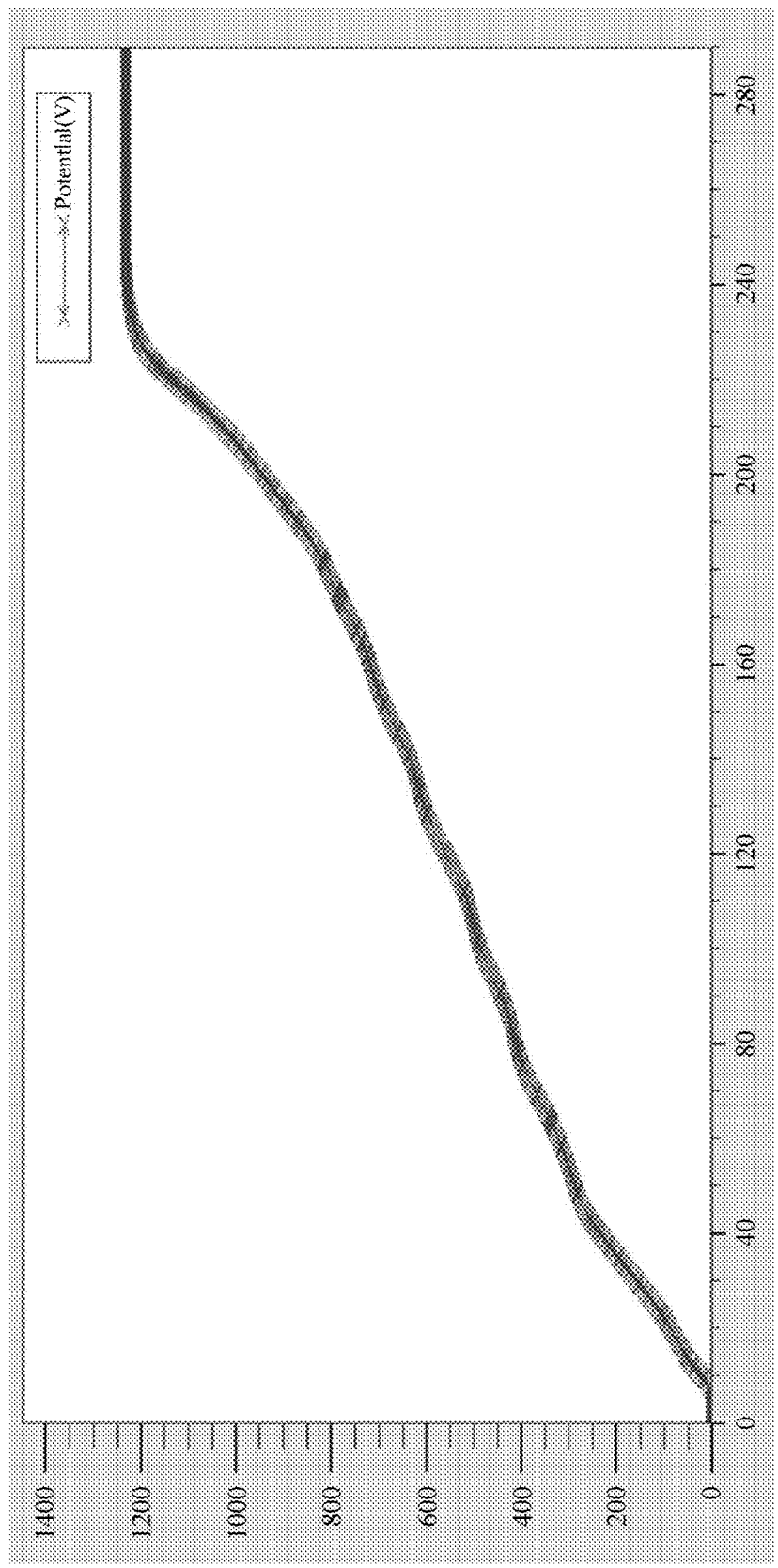
FIG. 2D is a graph showing a surface potential of a silicon based high voltage edge termination structure featuring a laterally modulated JTE structure at 1250V bias with surface charge of $5e^{11}Cm^{-2}$.

For a better understanding of the effect of the laterally modulated JTE structure discussed above, please refer to FIGS. 2A to 2D. FIG. 2A is a simulated structure showing a potential distribution contour of a silicon based high voltage edge termination structure featuring a laterally modulated JTE structure at 1300V bias with surface charge of $5e^{10}$ $Cm^{-2}$. FIG. 2B is a simulated structure showing a potential distribution contour of a silicon based high voltage edge termination structure featuring a laterally modulated JTE structure at 1250V bias with surface charge of $5e^{11}Cm^{-2}$. FIG. 2C is a graph showing the surface potential of a silicon based voltage high voltage edge termination structure featuring a laterally modulated JTE structure at 1300V bias with surface charge of $5e^{10}$ $Cm^{-2}$. FIG. 2D is a graph showing the surface potential of a silicon based voltage high voltage edge termination structure featuring a laterally modulated JTE structure at 1250V bias with surface charge of $5e^{11}Cm^{-2}$.

The high voltage edge termination structure featuring a laterally modulated JTE structure shows a constant depth of P-type JTE region modulated by Phosphorus implanted via varying size mask windows is used for the simulation. The size of the Phosphorus implant windows increases and the space between these windows shrinks to increase doping modulation along the direction from the active region toward the N-type heavily doped channel stop region, i.e. the die edge. The Phosphorous compensation implant modulates the doping concentration of the P-type JTE region to form the laterally modulated JTE region.

As shown in FIG. 2A, in the case of a low positive surface charge, i.e. Qss of $5e^{10}$ $Cm^{-2}$, this results in depletion spreading from the N-type heavily doped channel stop region toward the surface region of the P-type JTE region. As shown in FIG. 2B, in the case of high positive surface charge, i.e. Qss of $5e^{11}$ $Cm^{-2}$, depletion expansion from the P-type JTE region toward the N-type channel stop region is shrunk, however, due to doping modulation in the P-type JTE region, a shrink in the depletion expansion toward the N-type channel stop region will prompt depletion to expand deeper in the P-type JTE region toward the active region.

As shown in FIGS. 2C and 2D, the simulation result for both the cases of low and high surface charge shows a uniform surface potential distribution at 1300V and 1250V bias respectively. Thus, the laterally modulated JTE structure provided in accordance with the embodiment of the present invention may effectively prevent the power device from being breakdown at lower voltage. In practice, the high voltage edge termination structure featuring a laterally modulated JTE structure may achieve a breakdown voltage over 1200V for low and high surface charge cases.

Figure 3:
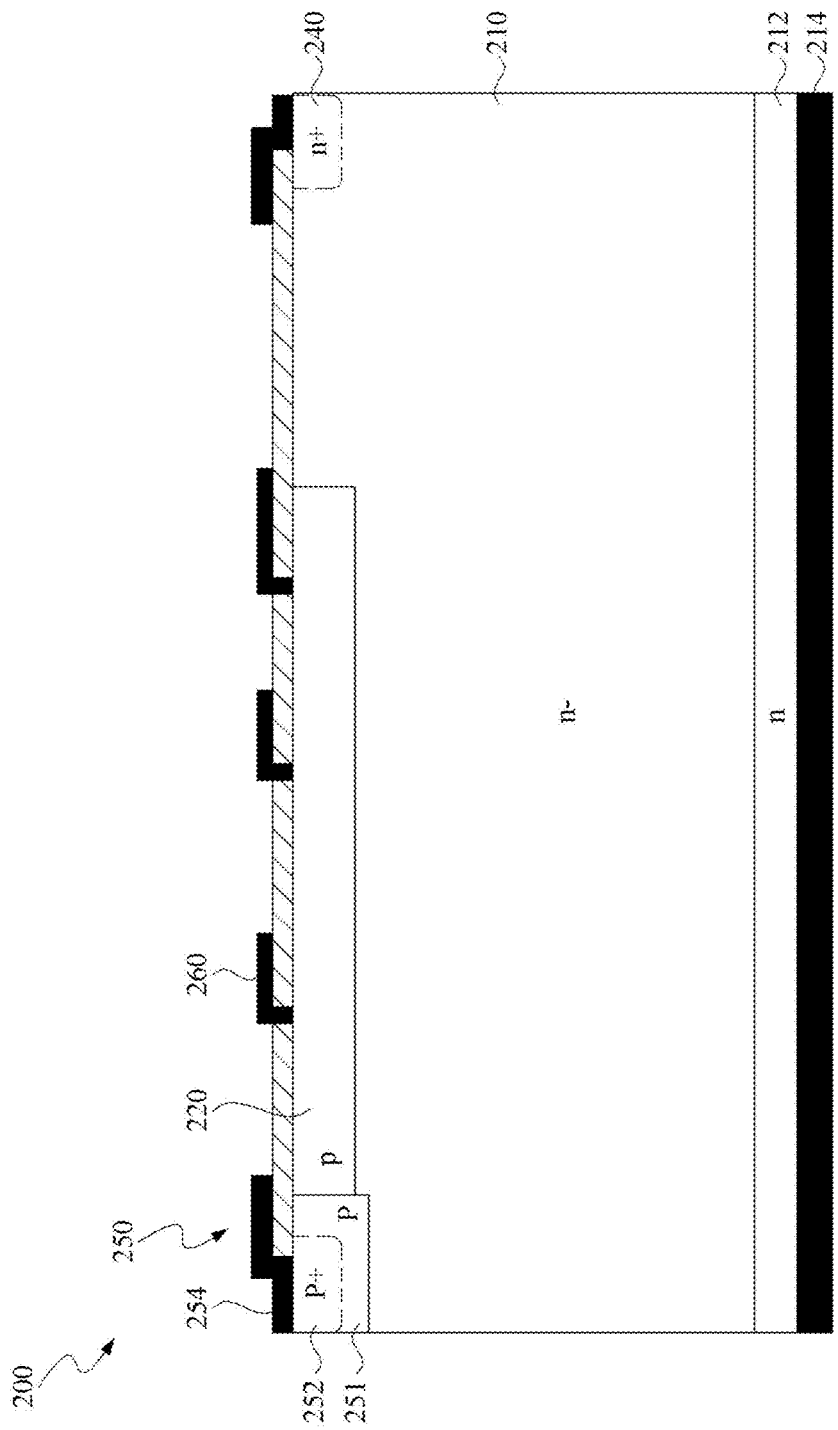
FIG. 3 is a schematic illustration showing a high voltage edge termination structure featuring a JTE structure with field plates provided in accordance with a second embodiment of the present invention.

Referring to FIG. 3, a high voltage edge termination structure featuring a JTE structure with field plates provided in accordance with a second embodiment of the present invention will be discussed.

As illustrated in FIG. 3, the high voltage edge termination structure 200 comprises an N-type semiconductor body 210, a P-type JTE region 220, an N-type heavily doped channel stop region 240, and a plurality of field plates 260 (three field plates are shown).

There is an N-type semiconductor layer 212 with a doping concentration higher than that of the N-type semiconductor body 210 formed on a lower surface of the N-type semiconductor body 210. The N-type semiconductor layer 212 is utilized for reducing contact resistance between the N-type semiconductor body 210 and a cathode electrode 214 of the power semiconductor device.

The P-type JTE region 220 is formed in the top portion of the N-type semiconductor body 210, i.e. the portion close to the upper surface thereof. The P-type JTE region 220 is adjacent to the active region 250 of the power semiconductor device and is extended from the active region 250 toward the edge. To be more precisely, the P-type JTE region 220 is extended from the P-type well 251 of the active region 250 toward the edge of the power semiconductor device. The P-type well 251 is electrically connected to the anode electrode 254 through a P-type heavily doped region 252.

The N-type heavily doped channel stop region 240 is formed in the top portion of the N-type semiconductor body 210 outside the P-type JTE region 220 for limiting the depletion region at the outer edge of the semiconductor device when the power semiconductor device is reverse-biased. The N-type heavily doped channel stop region 240 is spaced apart from the P-type JTE region 220 by an N-type region (part of the top portion of the N-type semiconductor body 210). That is, a lateral termination structure with the P-type JTE region 220, an N-type region, and the N-type heavily doped channel stop region 240 is formed. In the present embodiment, a metal layer is formed on the N-type heavily doped channel stop region 240. However, the metal layer on the N-type heavily doped channel stop region 240 may be skipped in some embodiments.

The plurality of field plates 260 is formed on the P-type JTE region 220. The field plates 260 on the P-type JTE region 220 may spread the electric field generated by the surface charge so as to minimize the reduction of the reverse bias breakdown voltage due to surface charge variations.

In an embodiment of the present invention, the field plates 260 may be made of a metal material to form a Schottky contact with the P-type JTE region 220. In an embodiment of the present invention, the field plates 260 may be made of a P-type poly-silicon material to form an ohmic contact with the P-type JTE region 220. In an embodiment of the present invention, the field plates 260 may be made of an N-type poly-silicon material to form a PN junction with the P-type JTE region 220.

Figure 4:
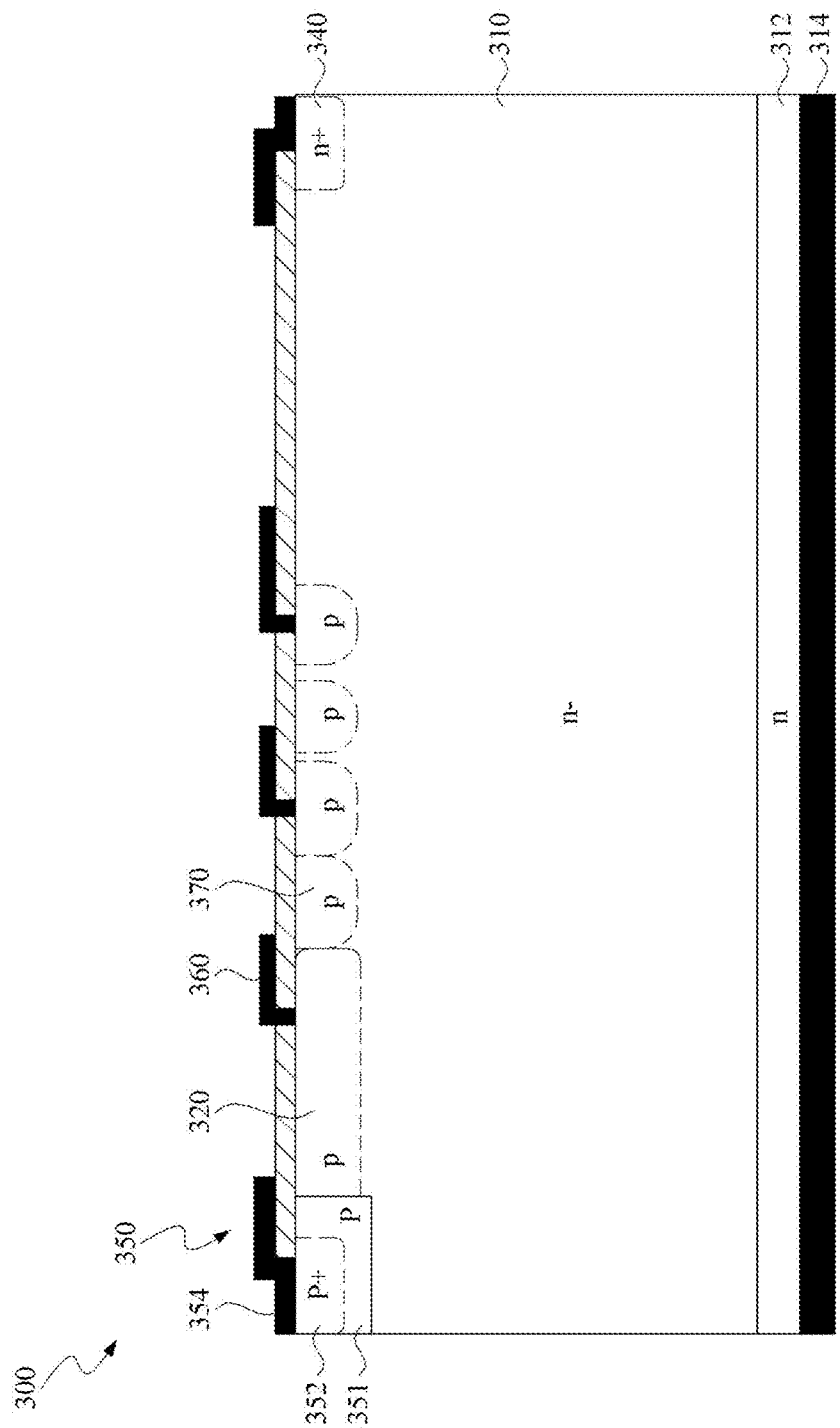
FIG. 4 is a schematic illustration showing a high voltage edge termination structure featuring a JTE structure with depletable guard rings provided in accordance with a third embodiment of the present invention.

Referring to FIG. 4, a high voltage edge termination structure featuring a JTE structure with depletable guard rings and field plates provided in accordance with a third embodiment of the present invention will be discussed.

As illustrated in FIG. 4, the high voltage edge termination structure 300 comprises an N-type semiconductor body 310, a P-type JTE region 320, an N-type heavily doped channel stop region 340, a plurality of field plates 360 (three field plates are shown), and a plurality of P-type depletable guard rings 370 (four depletable guard rings are shown).

There is an N-type semiconductor layer 312 with a doping concentration higher than that of the N-type semiconductor body 310 formed on a lower surface of the N-type semiconductor body 310. The N-type semiconductor layer 312 is utilized for reducing contact resistance between the N-type semiconductor body 310 and a cathode electrode 314 of the power semiconductor device.

The P-type JTE region 320 is formed in top portion of the N-type semiconductor body 310. The P-type JTE region 320 is adjacent to the active region 350 of the power semiconductor device. To be more precisely, the P-type JTE region 320 is adjacent to the P-type well 351 of the active region 350 of the power semiconductor device. The P-type well 351 is electrically connected to the anode electrode 354 through a P-type heavily doped region 352.

The N-type heavily doped channel stop region 340 is formed in the top portion of the N-type semiconductor body 310 outside the P-type JTE region 320 for limiting the depletion region at the outer edge of the semiconductor device when the power semiconductor device is reverse-biased. The N-type heavily doped channel stop region 340 is spaced apart from the P-type JTE region 320 by an N-type region (part of the top portion of the N-type semiconductor body 310). In the present embodiment, a metal layer is formed on the N-type heavily doped channel stop region 340. However, the metal layer on the N-type heavily doped channel stop region 340 may be skipped in some embodiments.

The plurality of P-type depletable guard rings 370 is formed in the top portion of the N-type semiconductor body 310, and the P-type depletable guard rings 370 are formed between the P-type JTE region 320 and the N-type heavily doped channel stop region 340. The P-type depletable guard rings 370 are electrically floating. When a high bias is applied, the P-type depletable guard ring 370 depletes to produces a charge balanced region for the N-type region between the P-type JTE region 320 and the N-type heavily doped channel stop region 340 to spread the depletion. This would be helpful for spreading the electric field generated by surface charge so as to minimize the reduction of the reverse bias breakdown voltage due to surface charge variations.

The plurality of field plates 360 is formed on the P-type JTE region 320 and the P-type depletable guard rings 370. The field plates 360 may spread the electric field generated by the surface charge so as to minimize the reduction of the reverse bias breakdown voltage due to surface charge variations.

Figure 4A:
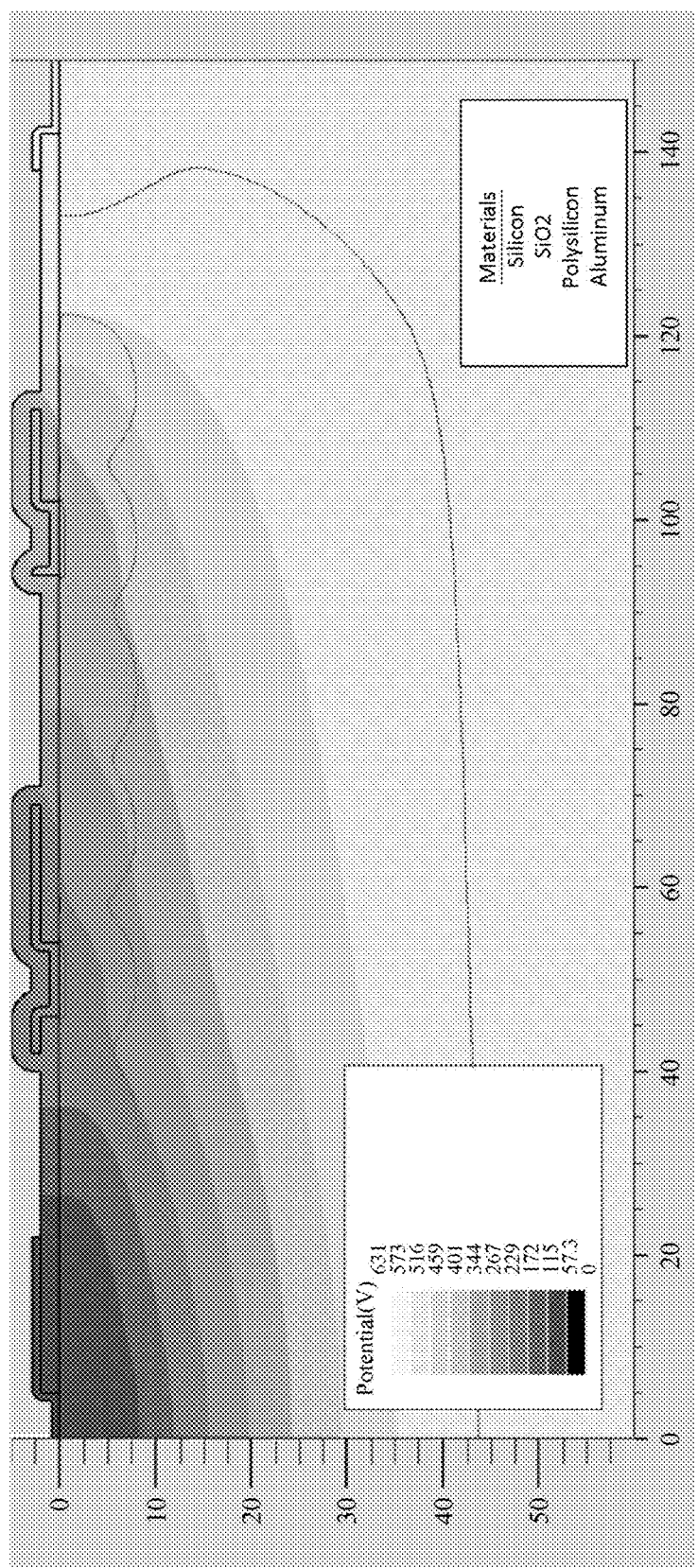
FIG. 4A is a simulated structure showing a potential distribution contour of a silicon based high voltage edge termination structure featuring a JTE structure with depletable guard rings and field plates at 630V bias with surface charge of $5e^{10}$ $Cm^{-2}$.
Figure 4B:
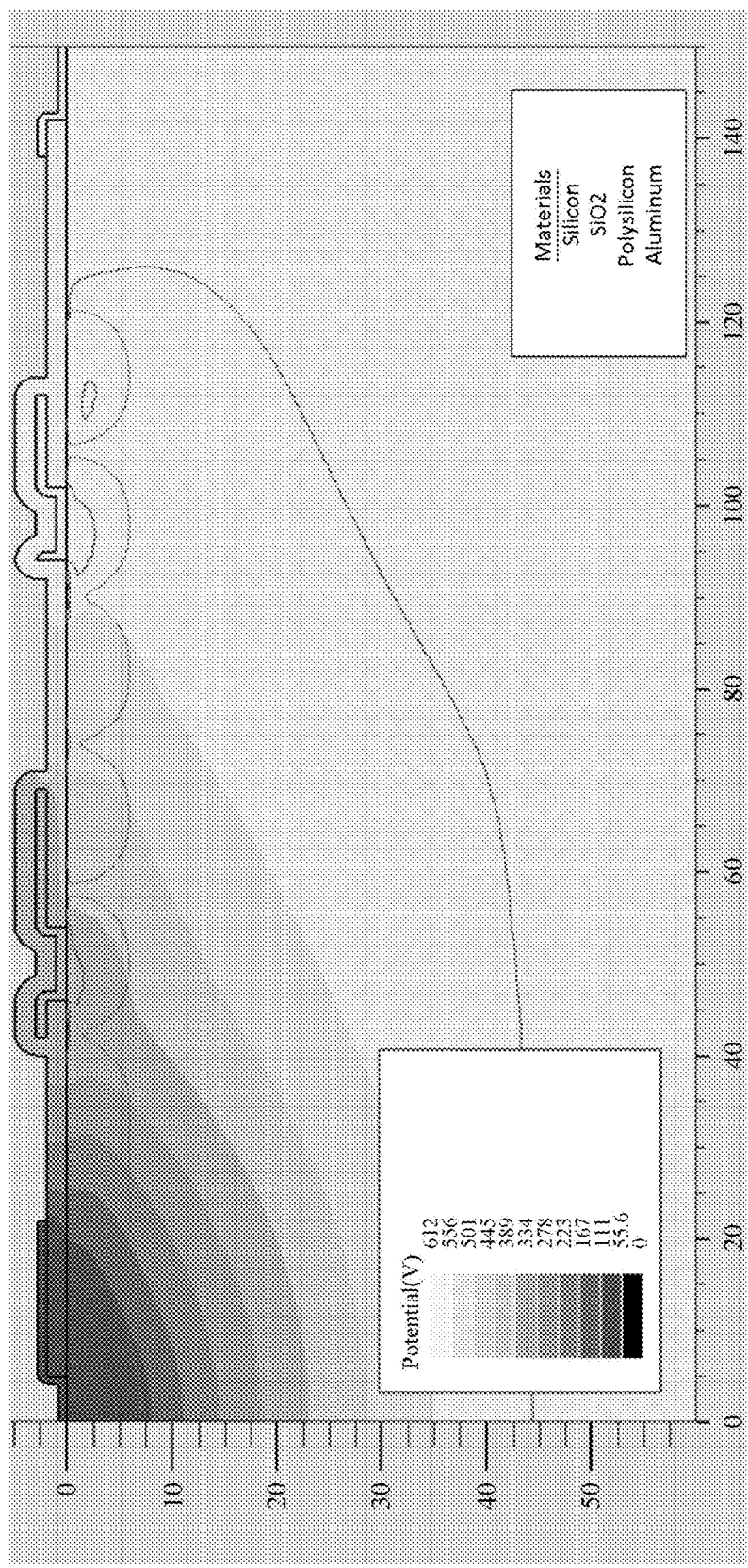
FIG. 4B is a simulated structure showing a potential distribution contour of a silicon based high voltage edge termination structure featuring a JTE structure with depletable guard rings and field plates at 630V bias with surface charge of $5e^{11}$ $Cm^{-2}$.
Figure 4C:
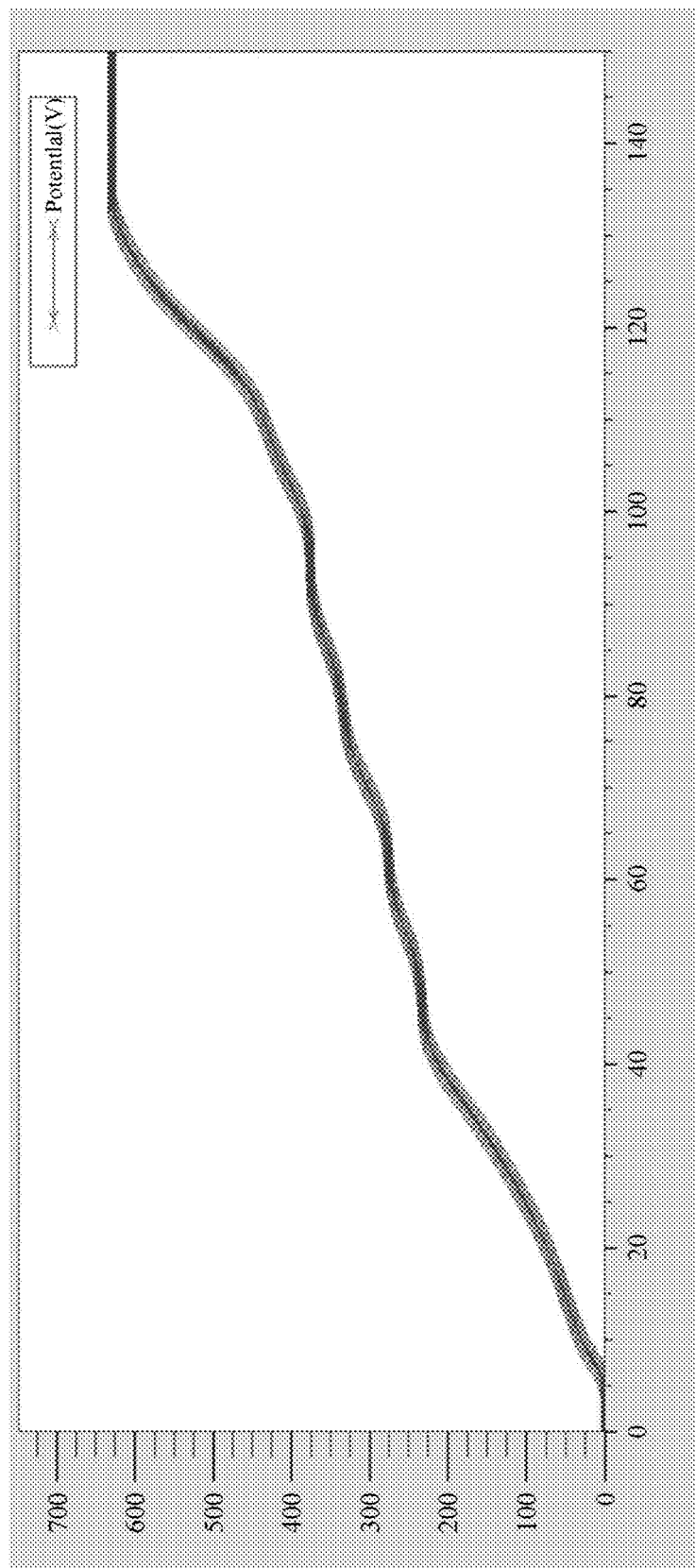
FIG. 4C is a graph showing a surface potential of a silicon based high voltage edge termination structure featuring a JTE structure with depletable guard rings and field plates at 630V bias with surface charge of $5e^{10}$ $Cm^{-2}$.
Figure 4D:
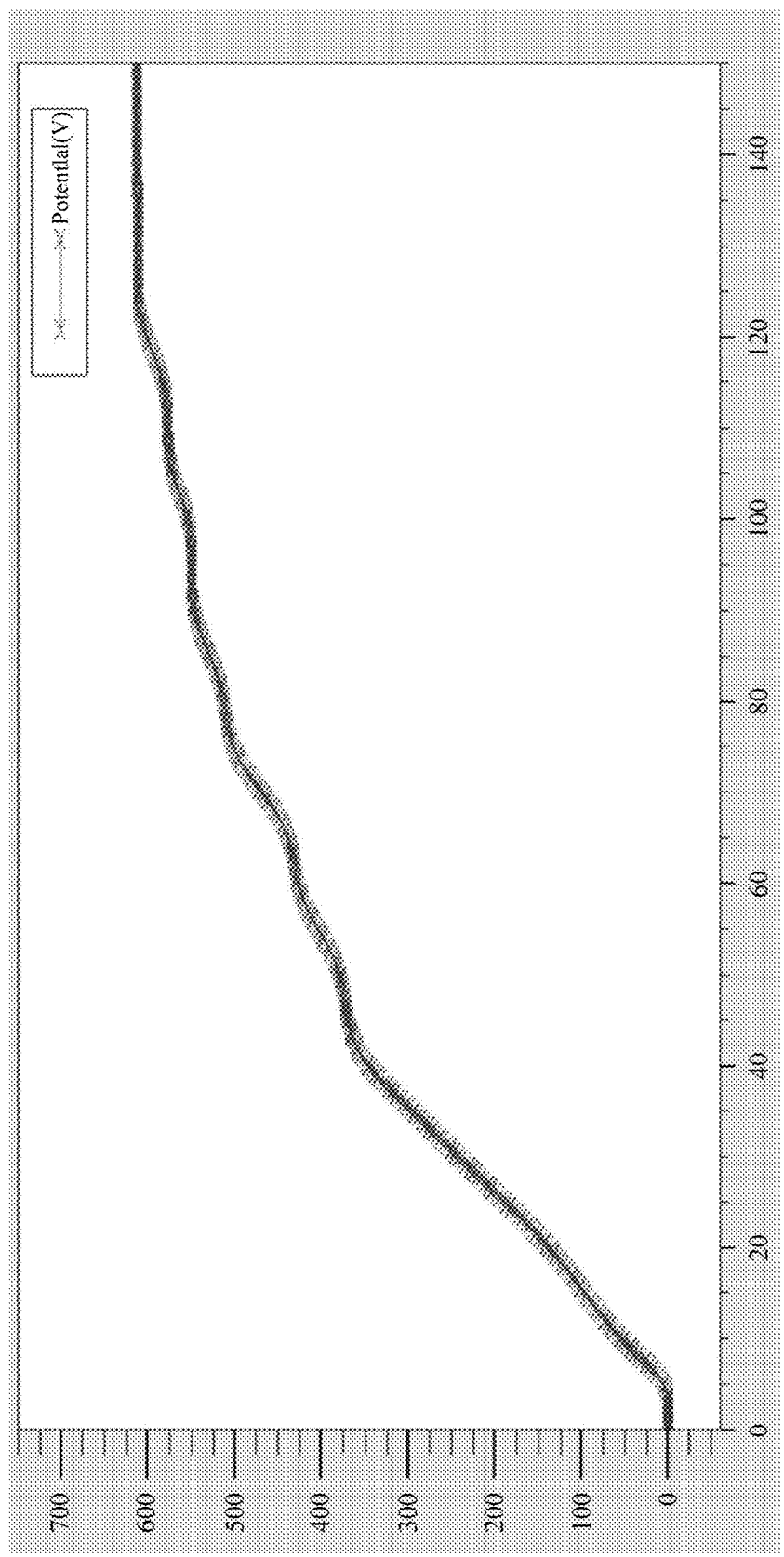
FIG. 4D is a graph showing a surface potential of a silicon based high voltage edge termination structure featuring a JTE structure with depletable guard rings and field plates at 630V bias with surface charge of $5e^{11}Cm^{-2}$.

For a better understanding of the effect of the depletable guard rings and the field plates together with the JTE structure discussed above, please refer to FIGS. 4A to 4D. FIG. 4A is a simulated structure showing a potential distribution contour of a silicon based high voltage edge termination structure featuring a JTE structure with depletable guard rings and field plates at 630V bias with surface charge of $5e^{10}$ $Cm^{-2}$. FIG. 4B is a-simulated structure showing a potential distribution contour of a silicon based high voltage edge termination structure featuring a JTE structure with depletable guard rings and field plates at 630V bias with surface charge of $5e^{11}Cm^{-2}$. FIG. 4C is graph showing a surface potential of a silicon based high voltage edge termination structure featuring a JTE structure with depletable guard rings and field plates at 630V bias with surface charge of $5e^{10}$ $Cm^{-2}$. FIG. 4D is a graph showing a surface potential of a silicon based high voltage edge termination structure featuring a JTE structure with depletable guard rings and field plates at 630V bias with surface charge of $5e^{11}$ $Cm^{-2}$.

The high voltage edge termination structure featuring a P-type JTE region shows a constant depth, five P-type depletable guard rings located between the P-type JTE region and the N-type channel stop region, and two field plates is used for the simulation.

Please refer to FIGS. 4A and 4B, in the case of high surface charge, i.e. Qss of $5e^{11}Cm^{-2}$, depletion spreads more into P-type JTE region and less in the N-type region between the last P-type depletable guard ring and the N-type heavily doped channel stop region in comparison to the case of low surface charge, i.e. Qss of $5e^{10}$ $Cm^{-2}$. The field plates on the P-type depletable guard rings would be helpful for spreading the depletion region in the N-type region between last P-type depletable guard ring and the N-type heavily doped channel stop region toward the die edge to prevent breakdown voltage degradation.

As shown in FIGS. 4C and 4D, the simulation result for both the cases of low and high surface charge shows a uniform surface potential distribution at 630V bias. Thus, the high voltage edge termination structure featuring a JTE structure with depletable guard rings and field plates provided in accordance with the embodiment of the present invention may effectively prevent the power device from being breakdown at lower voltage. In practice, the high voltage edge termination structure featuring a JTE structure with depletable guard rings and field plates may achieve a breakdown voltage over 600V for low and high surface charge cases.

Both the high voltage edge termination structure featuring a JTE structure with depletable guard rings shown in FIG. 3 and the high voltage edge termination structure featuring a JTE structure with depletable guard rings and field plates shown in FIG. 4 work the same in principle by countering depletion region shrinkage of high surface charge cases to achieve the required breakdown voltage from the termination of a power device. The field plate may assume the potential of the P-type region which the field plate is in contact with, e.g. the P-type JTE region or the P-type depletable guard ring, regardless of the type of electrical contact formed between the field plate and the P-type region. These field plates with potential established by the P-type regions in contact with will reduce the increasing of the surface electric field as the surface charge increases by spreading surface potential to a longer depletion region.

The usage of field plates and depletable guard rings in conjunction with the JTE structure as shown in FIGS. 3 and 4 are capable to be used for the power devices up to 600V. The usage of field plates and depletable guard rings in conjunction with the laterally modulated JTE structure as shown in FIG. 5 and FIG. 6 may provide extra capability to minimize breakdown reduction with increasing surface charge for the power devices of a breakdown voltage about 1200V or higher.

Figure 5:
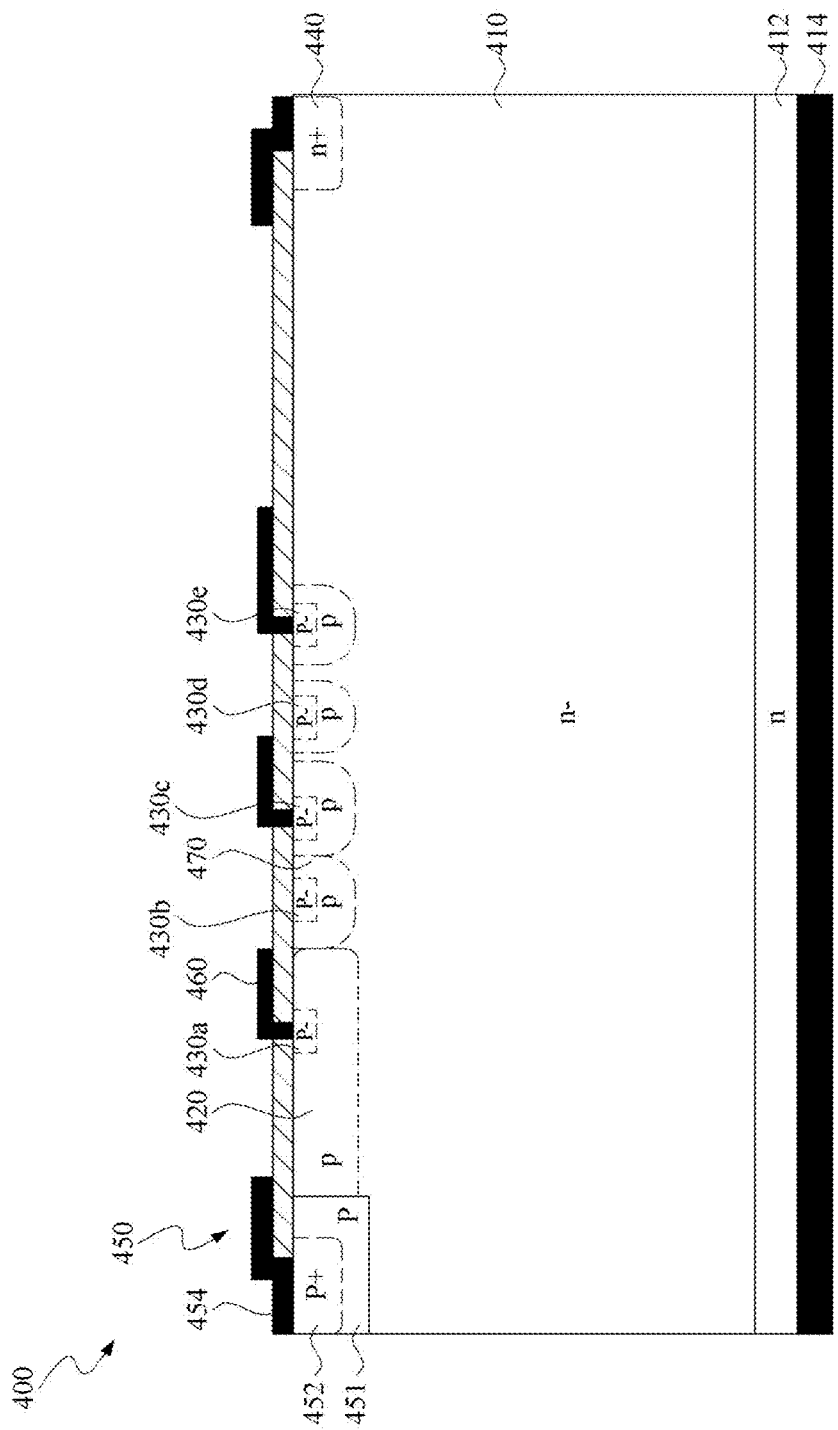
FIG. 5 is a schematic illustration showing a high voltage edge termination structure featuring a laterally modulated JTE structure with depletable guard rings and field plates provided in accordance with a fourth embodiment of the present invention.
Figure 6:
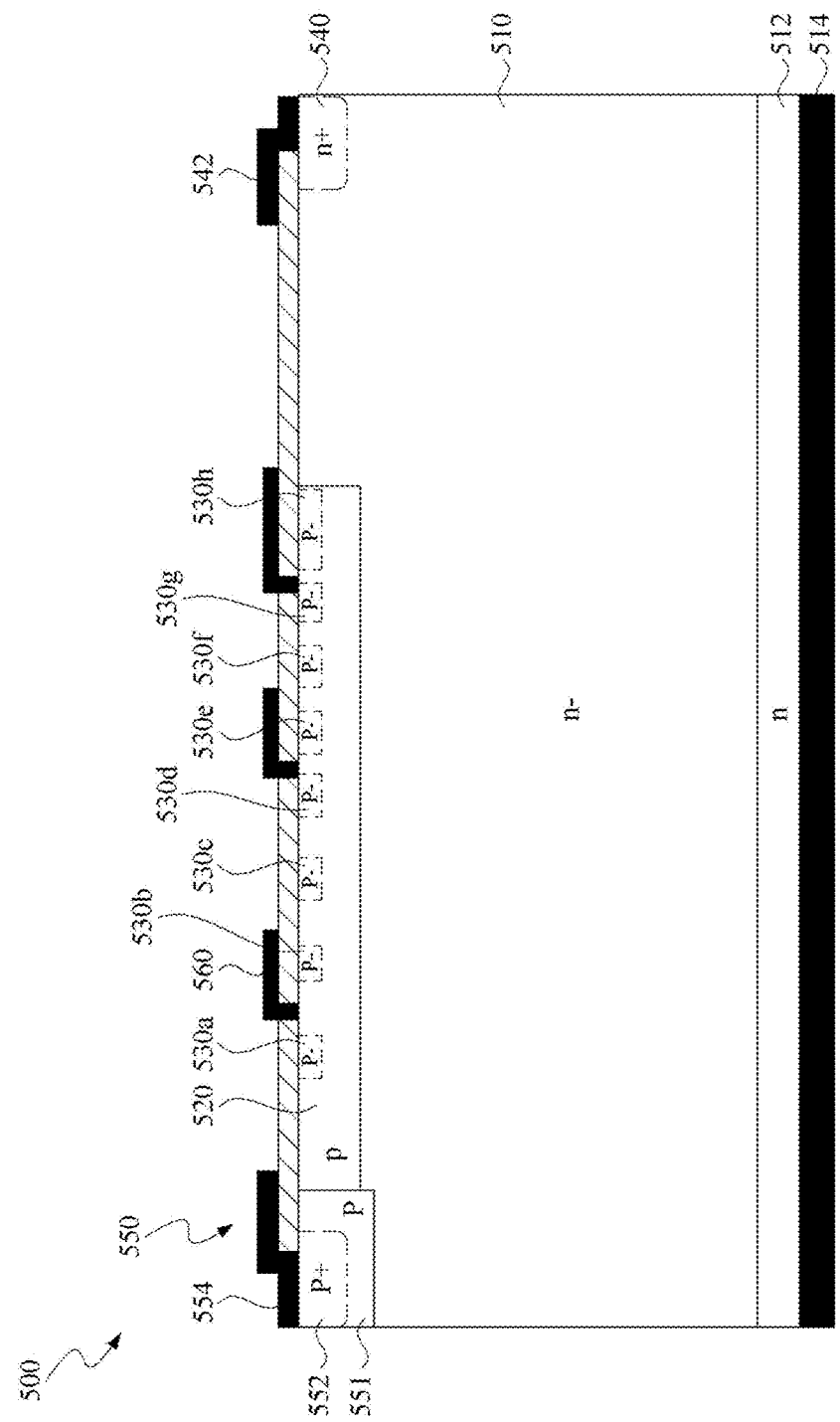
FIG. 6 is a schematic illustration showing a high voltage edge termination structure featuring a laterally modulated JTE structure with field plates provided in accordance with a fourth embodiment of the present invention.

Referring to FIG. 5, a high voltage edge termination structure featuring a laterally modulated JTE structure with depletable guard rings and field plates provided in accordance with a fourth embodiment of the present invention will be discussed.

As illustrated in FIG. 5, the high voltage edge termination structure 400 comprises an N-type semiconductor body 410, a P-type JTE region 420, a plurality of P-type lightly doped regions 430a-430e, an N-type heavily doped channel stop region 440, a plurality of field plates 460 (three field plates are shown) and a plurality of P-type depletable guard rings 470 (four depletable guard rings are shown).

There is an N-type semiconductor layer 412 with a doping concentration higher than that of the N-type semiconductor body 410 formed on a lower surface of the N-type semiconductor body 410. The N-type semiconductor layer 412 is utilized for reducing contact resistance between the N-type semiconductor body 410 and a cathode electrode 414 of the power semiconductor device.

The P-type JTE region 420 is formed in the top portion of the N-type semiconductor body 410. The P-type JTE region 420 is adjacent to the active region 450 of the power semiconductor device. To be more precisely, the P-type JTE region 420 is adjacent to the P-type well 451 of the active region 450 of the power semiconductor device. The P-type well 451 is electrically connected to the anode electrode 454 through a P-type heavily doped region 452.

The N-type heavily doped channel stop region 440 is formed in the top portion of the N-type semiconductor body 410 outside the P-type JTE region 420 for limiting the depletion region at the outer edge of the semiconductor device when the power semiconductor device is reverse-biased. In the present embodiment, a metal layer is formed on the N-type heavily doped channel stop region 440. However, the metal layer on the N-type heavily doped channel stop region 440 may be skipped in some embodiments.

Some of the P-type lightly doped regions, i.e. the P-type lightly doped region 430a, is formed in the upper portion of the P-type JTE region 420. The P-type JTE region 420 and the P-type lightly doped region 430a therein form a P-type laterally modulated JTE region.

The P-type depletable guard rings 470 are formed in the top portion of the N-type semiconductor body 410, and is located between the P-type JTE region 420 and the N-type heavily doped channel stop region 440. The P-type depletable guard rings 470 are electrically floating. When a high bias is applied, the P-type depletable guard ring 470 depletes to produces a charge balanced region for the N-type region between the P-type JTE region 420 and the N-type heavily doped channel stop region 440 to spread the depletion. This would be helpful for spreading the electric field generated by surface charge so as to minimize the reduction of the reverse bias breakdown voltage due to surface charge variations.

The P-type lightly doped regions 430a-430e are formed in the upper portion of the P-type JTE region 420 and the P-type depletable guard rings 470 for modulating the P-type JTE region 420 and the P-type depletable guard rings 470. As shown, the P-type lightly doped region 430a is located in the upper portion of the P-type JTE region 420, the P-type lightly doped regions 430b~430e are located in the P-type depletable guard rings 470 respectively. These P-type lightly doped regions 430a~430e are spaced apart from each other. As shown, a lateral termination structure with the P-type laterally modulated JTE region, the P-type depletable guard rings 470, the N-type region (part of the upper portion of the N-type semiconductor body), and the N-type heavily doped channel stop region 440 extended from the active region 450 to the edge is formed.

The plurality of field plates 460 is formed on the P-type JTE region 420 and the P-type depletable guard rings 470. The field plates 460 may spread the electric field generated by the surface charge so as to minimize the reduction of the reverse bias breakdown voltage due to surface charge variations. In an embodiment of the present invention, the field plates 460 may be made of a metal material to form a Schottky contact with the P-type region, i.e. the P-type JTE region 420 or the P-type depletable guard ring 470. In an embodiment of the present invention, the field plates 460 may be made of a P-type poly-silicon material to form an ohmic contact with the P-type region. In an embodiment of the present invention, the field plates 460 may be made of an N-type poly-silicon material to form a PN junction with the P-type region.

As mentioned above, the P-type laterally modulated JTE region shows the structure featuring multiple P and P– regions to minimize the reduction of the reverse bias breakdown voltage due to surface charge variations, the field plates and the depletable guard rings may counter depletion region shrinkage of high surface charge cases to achieve the required breakdown voltage from the termination of a power device.

Referring to FIG. 6, a high voltage edge termination structure featuring a laterally modulated JTE structure with field plates provided in accordance with a fourth embodiment of the present invention will be discussed.

As illustrated in FIG. 6, the high voltage edge termination structure 500 comprises an N-type semiconductor body 510, a P-type JTE region 520, a plurality of P-type lightly doped regions 530a~530h, an N-type heavily doped channel stop region 540, and a plurality of field plates 560 (three field plates are shown).

There is an N-type semiconductor layer 512 with a doping concentration higher than that of the N-type semiconductor body 510 formed on a lower surface of the N-type semiconductor body 510. The N-type semiconductor layer 512 is utilized for reducing contact resistance between the N-type semiconductor body 510 and a cathode electrode 514 of the power semiconductor device.

The P-type JTE region 520 is formed in the top portion of the N-type semiconductor body 510. The P-type JTE region 520 is adjacent to the active region 550 of the power semiconductor device and is extended from the active region 550 toward the edge. To be more precisely, the P-type JTE region 520 is adjacent to the P-type well 551 of the active region 550 of the power semiconductor device. The P-type well 551 is electrically connected to the anode electrode 554 through a P-type heavily doped region 552.

The P-type lightly doped regions 530a~530h are formed in the upper portion of the P-type JTE region 520, i.e. the portion close to the upper surface of the P-type JTE region 520. These P-type lightly doped regions 530a~530h are spaced apart from each other.

The N-type heavily doped channel stop region 540 is formed in the top portion of the N-type semiconductor body 510 outside the P-type JTE region 520 for limiting the depletion region at the outer edge of the semiconductor device when the power semiconductor device is reverse-biased. In the present embodiment, a metal layer is formed on the N-type heavily doped channel stop region 540. However, the metal layer on the N-type heavily doped channel stop region 540 may be skipped in some embodiments.

The P-type JTE region 520 and the plurality of P-type lightly doped regions 530a~530h therein form a P-type laterally modulated JTE region. The N-type heavily doped channel stop region 540 is spaced apart from the P-type JTE region 520 by an N-type region, i.e. the surface portion of the N-type semiconductor body 510. That is, a lateral termination structure with the P-type laterally modulated JTE region, the N-type region, and the N-type heavily doped channel stop region 540 extended from the active region 550 to the edge is formed. The P-type laterally modulated JTE region shows the structure featuring the alternatively arranged P and P– regions close to the upper surface of the semiconductor body for spreading depletion. Thus, the P-type laterally modulated JTE region may minimize the reduction of the reverse bias breakdown voltage due to surface charge variations.

Similar to the embodiment shown in FIG. 2, in accordance with a preferred embodiment of the present invention, a lateral width of the P-type lightly doped regions 530a~530h becomes larger along a direction toward the N-type heavily doped channel stop region 540, and a space between the P-type lightly doped region 530a in a vicinity of the active region 550 and the active region 550 is greater than a space between the neighboring P-type lightly doped regions 530b-530h. With the doping modulation in the P-type JTE region 520, a shrink in the depletion expansion toward the N-type heavily doped channel stop region 540 will prompt depletion to expand deeper in the P-type JTE region 520 toward the active region 550. Embodiments of the present invention are not limited to the present configuration. The variation of the lateral width of the lightly doped regions 530a~530h as well as the arrangement of the lightly doped regions 530a~530h in the JTE region 520 may be adjusted according to the actual condition and should not be deemed as departing from the scope of the present invention.

The plurality of field plates 560 is formed on the P-type JTE region 520. The field plates 560 may counter depletion region shrinkage of high surface charge cases to achieve the required breakdown voltage from the termination of a power device. That is, the field plates 560 are also helpful for minimizing the reduction of the reverse bias breakdown voltage due to surface charge variations. In an embodiment of the present invention, the field plates 560 may be made of a metal material to form a Schottky contact with the P-type JTE region 520. In an embodiment of the present invention, the field plates 560 may be made of a P-type poly-silicon material to form an ohmic contact with the P-type JTE region 520. In an embodiment of the present invention, the field plates 560 may be made of an N-type poly-silicon material to form a PN junction with the P-type JTE region 520.

FIGS. 7A to 7G are schematic illustration showing a manufacturing process of a high voltage edge termination structure featuring a JTE structure with depletable guard rings and field plates provided in accordance with an embodiment of the present invention.

Six masks are used in the manufacturing process. Mask 1 is for defining the channel stop region. Mask 2 is for executing the JTE implantation. Mask 3 is for forming the anode of the active region. Mask 4 is for forming the contact. Mask 5 is for forming the metal layer. Mask 6 is for forming the passivation/polyimide layer.

Figure 7A:
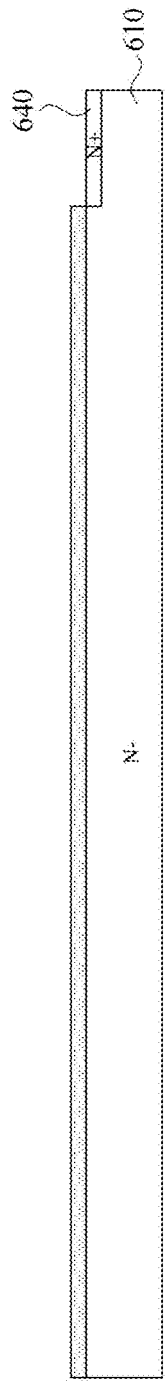
FIGS. 7A to 7G are schematic illustration showing a manufacturing process of a high voltage edge termination structure featuring a JTE structure with depletable guard rings and field plates provided in accordance with an embodiment of the present invention.

Referring to FIG. 7A, firstly, an N-type semiconductor body 610 is provided. Then, Mask 1 is used to define the channel stop window for forming the channel stop region, and then an N-type heavily doped channel stop region 640 is formed in the N-type semiconductor body 610 by ion implantation or diffusion. By way of example, but not of limitation, phosphorus ions with a doping concentration ranging from $1e^{15}$ $Cm^{-2}$ to $1e^{16}$ $Cm^{-2}$ may be implanted into the N-type semiconductor body 610 to form the N-type heavily doped channel stop region 640, or a $POCl_3$ diffusion process may be used to form the N-type heavily doped channel stop region 640 in the N-type semiconductor body 610.

Figure 7B:
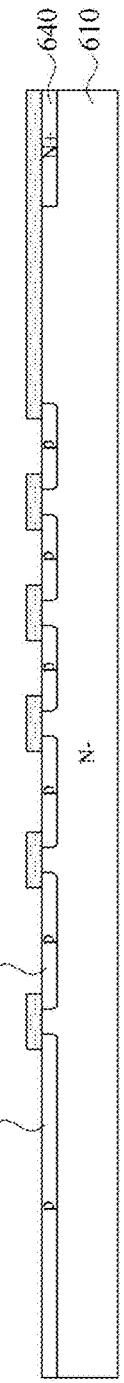

Afterward, referring to FIG. 7B, Mask 2 is used to define the position of the P-type JTE region and the P-type depletable guard rings, and then an ion implantation step is carried out to form the P-type JTE region 620 and the P-type depletable guard rings 670 simultaneously. The P-type JTE region 620 is adjacent to the active region of the power semiconductor device and is spaced apart from the N-type heavily doped channel stop region 640. The depletable guard rings 670 are formed between the P-type JTE region 620 and the N-type heavily doped channel stop region 640. By way of example, but not of limitation, boron ions with a doping concentration ranging from $5e^{12}$ $Cm^{-2}$ to $2e^{13}Cm^{-2}$ may be implanted into the N-type semiconductor body 610 to form the P-type JTE region 620 and the P-type depletable guard rings 670.

Figure 7C:
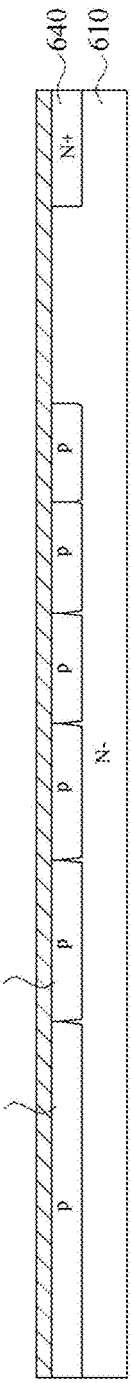

Thereafter, referring to FIG. 7C, after the ion implantation step of FIG. 7B, a high-temperature diffusion step is executed to drive the P-type JTE region 620 and the P-type depletable guard rings 670 deeper. By way of example, but not of limitation, the high-temperature diffusion step may have the P-type JTE region 620 achieves a junction depth ranging from 5 um to 10 um.

Figure 7D:
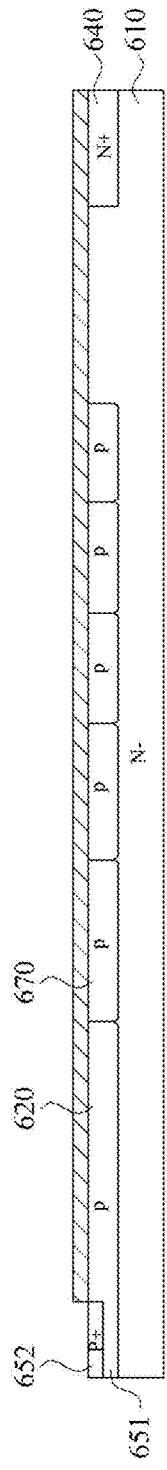

Afterward, referring to FIG. 7D, Mask 3 is used to define the position of the anode region in the active region and then an ion implantation step may be executed to form the anode region 652 in the active region. By way of example, but not of limitation, boron ions with a doping concentration ranging from $1e^{14}$ $Cm^{-2}$ to $5e^{15}$ $Cm^{-2}$ may be implanted into the P-type well 651 in the active region to form the P-type anode region 652.

Figure 7E:
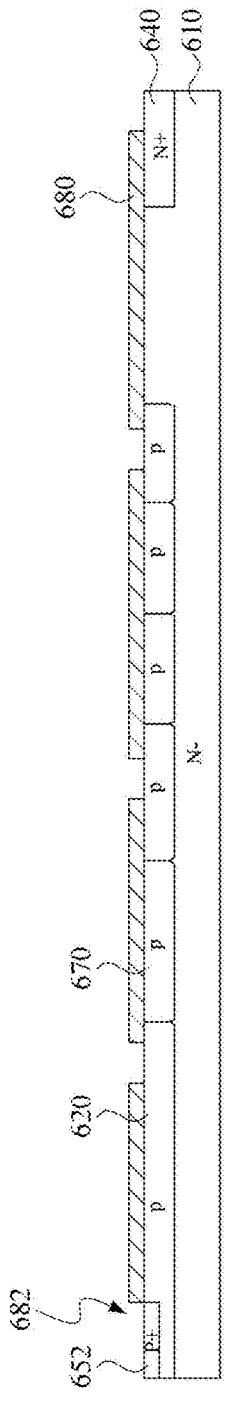

Then, referring to FIG. 7E, a dielectric layer 680 is deposited on the semiconductor body 610. By way of example, but not of limitation, the dielectric layer 680 may be an oxide layer, a Phosphosilicate glass (PSG) layer or a borophosphosilicate glass (BPSG) layer. Then, Mask 4 is used to form the contact windows 682 in the dielectric layer 680.

Figure 7F:
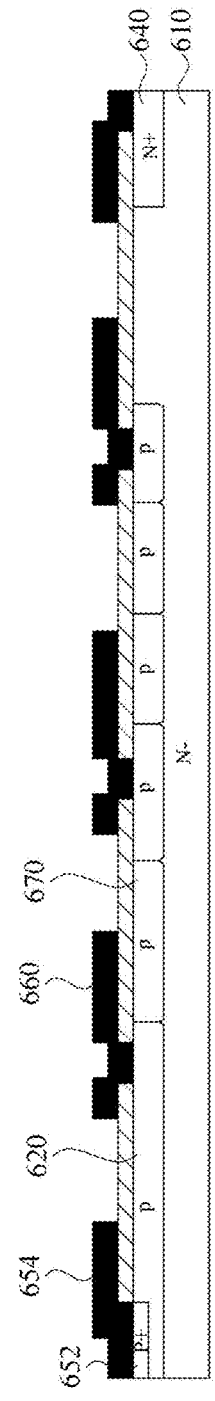

Afterward, referring to FIG. 7F, a metal layer is deposited on the dielectric layer 680 and fills the contact window 682. Thereafter, Mask 5 is used to define the anode electrode and the field plates, and then an etching step is carried out to form the anode electrode 654 and the field plates 660. By way of example, but not of limitation, the metal layer may be an AlCu layer or an AlSiCu layer with or without the Ti/TiN buffer layer depending on the junction depths.

Figure 7G:
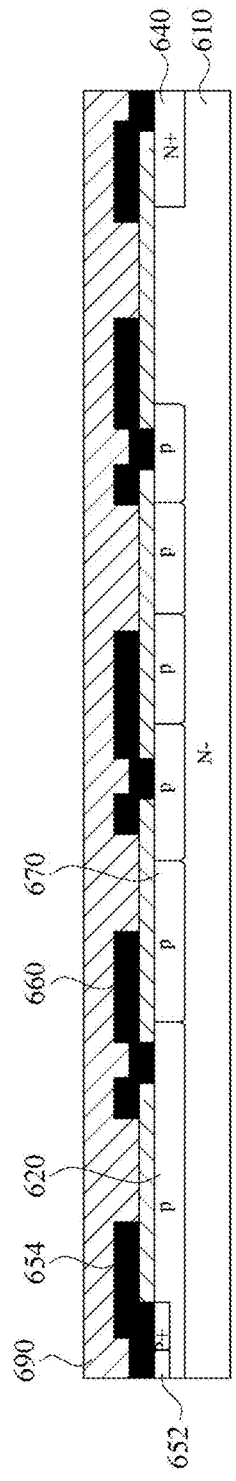

Referring to FIG. 7G, after the formation of the anode electrode 654 and the field plates 660, a passivation layer 690 is deposited. By way of example, but not of limitation, the passivation layer 690 may be a $SiO_2$ type passivation layer or a $Si_3N_4$ type passivation layer. By way of example, but not of limitation, a polyimide layer may be used to replace the passivation layer. Then, after the deposition of the passivation layer 690, Mask 6 is applied to define the bonding pad areas (not shown).

It is noted that the aforementioned manufacturing process utilizes a single mask (Mask 2) to define the P-type JTE region 620 and the P-type depletable guard rings 670, and a single mask to define the anode electrode 654 and the field plates 660 so as to reduce the masking steps.

FIGS. 8A to 8G are schematic illustration showing a manufacturing process of a high voltage edge termination structure featuring a laterally modulated JTE structure provided in accordance with an embodiment of the present invention.

Seven masks are used for the manufacturing process. Mask 1 is for defining the channel stop region. Mask 2 is for executing the JTE implantation. Mask 3 is for forming the lightly doped regions in the JTE region to form the laterally modulated JTE region. Mask 4 is for forming the anode of the active region. Mask 5 is for forming the contact. Mask 6 is for forming the metal layer. Mask 7 is for forming the passivation/polyimide layer.

Figure 8A:
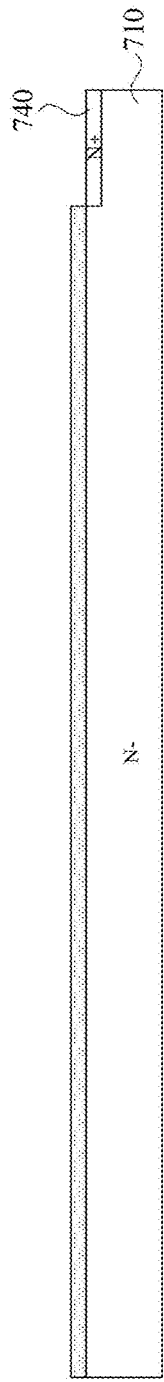

Referring to FIG. 8A, firstly, an N-type semiconductor body 710 is provided. Then, Mask 1 is used to define the channel stop window for forming the channel stop region, and then the N-type heavily doped channel stop region 740 is formed in the N-type semiconductor body 710 by ion implantation or diffusion. By way of example, but not of limitation, phosphorus ions with a doping concentration ranging from $1e^{15}$ $Cm^{-2}$ to $1e^{16}$ $Cm^{-2}$ may be implanted into the N-type semiconductor body 710 to form the N-type heavily doped channel stop region 740, or a $POCl_3$ diffusion process may be used to form the N-type heavily doped channel stop region 740 in the N-type semiconductor body 710.

Figure 8B:
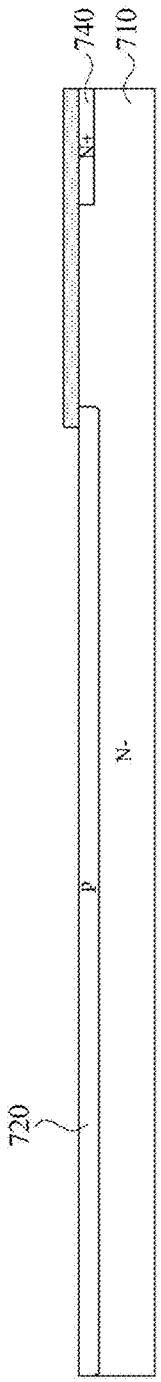

Afterward, referring to FIG. 8B, Mask 2 is used to define the position of the P-type JTE region, and then the P-type JTE region 720 is formed by ion implantation. The P-type JTE region 720 is adjacent to the active region of the power semiconductor device and is spaced apart from the N-type heavily doped channel stop region 740. By way of example, but not of limitation, boron ions with a doping concentration ranging from $5e^{12}$ $Cm^{-2}$ to $2e^{13} Cm^{-2}$ may be implanted into the N-type semiconductor body 710 to form the P-type JTE region 720.

Figure 8C:
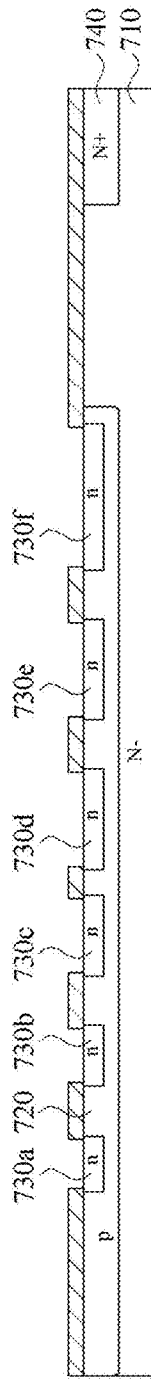

Thereafter, referring to FIG. 8C, Mask 3 is used to define a plurality of lightly doped regions in the P-type JTE region 720, and then an ion implantation step is executed to form the plurality of lightly doped regions 730a~730f in the P-type JTE region 720. By way of example, but not of limitation, these P-type lightly doped regions 730a~730f may be formed by implanting N-type impurities via the dedicated Mask 3 with varying open areas into the P-type JTE region 720 to counter dope the P-type JTE region 720.

These P-type lightly doped regions 730a~730f may be used to modulate the doping concentration of the P-type JTE region 720 from the active region toward the edge. By way of example, but not of limitation, a lateral width of these P-type lightly doped regions 730a~730f becomes larger along a direction from the active region toward the N-type heavily doped channel stop region 740, and a space between the P-type lightly doped region 730a in a vicinity of the active region and the active region is greater than a space between the neighboring lightly doped regions 730b~730f.

After the ion implantation step, a high-temperature diffusion step is executed to drive the P-type JTE region 720 deeper. By way of example, but not of limitation, the high-temperature diffusion step may have the P-type JTE region 720 achieves a junction depth ranging from 5 um to 10 um.

Figure 8D:
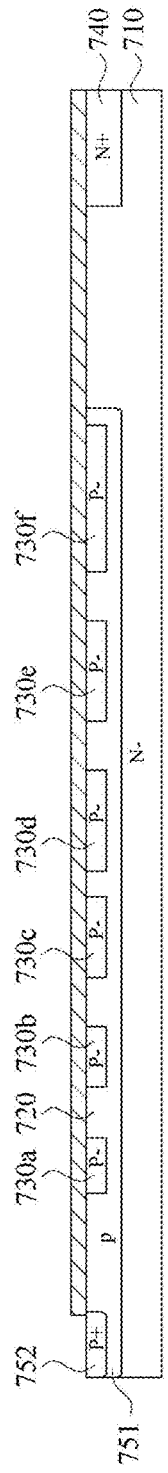

Afterward, referring to FIG. 8D, Mask 4 is used to define the position of the anode region in the active region and then an ion implantation step is executed to form the anode region 752. By way of example, but not of limitation, boron ions with a doping concentration ranging from $1e^{14}$ $Cm^{-2}$ to $5e^{15}$ $Cm^{-2}$ may be implanted into the P-type well 751 in the active region to form the P-type anode region 752.

Then, referring to FIG. 8E, a dielectric layer 780 is deposited on the semiconductor body 710. By way of example, but not of limitation, the dielectric layer 780 may be an oxide layer, a PSG layer or a BPSG layer. Then, Mask 5 is used to form the contact windows 782 in the dielectric layer 780.

Referring to FIG. 8F, a metal layer is deposited on the dielectric layer 780 and fills the contact window 782. Thereafter, Mask 6 is used to define the anode electrode and the field plates, and then an etching step is carried out to form the anode electrode 754 and the field plates 760. By way of example, but not of limitation, the metal layer may be an AlCu layer or an AlSiCu layer with or without the Ti/TiN buffer layer depending on the junction depths.

Referring to FIG. 8G, after the formation of the anode electrode 754 and the field plates 760, a passivation layer 790 is deposited. By way of example, but not of limitation, the passivation layer 790 may be a $SiO_2$ type passivation layer or a $Si_3N_4$ type passivation layer. By way of example, but not of limitation, a polyimide layer may be used to replace the passivation layer 790. Then, after the deposition of the passivation layer 790, Mask 6 is applied to define the bonding pad areas (not shown).

It is noted that the aforementioned manufacturing process utilizes a single mask (Mask 2) to define the P-type JTE region 720 to establish uniformity in lower portion of the P-type JTE region 720 and a modulation mask (Mask 3) with varying implant window openings is used to counter dope the P-type JTE region 720. The varying window openings enable compensation of the upper portion of the P-type JTE region 720. The opening area of the modulation mask (Mask 3) may be increased along the direction toward the device edge to form more P-type lightly doped regions 730a~730f to spread depletion.

Figure 1A:
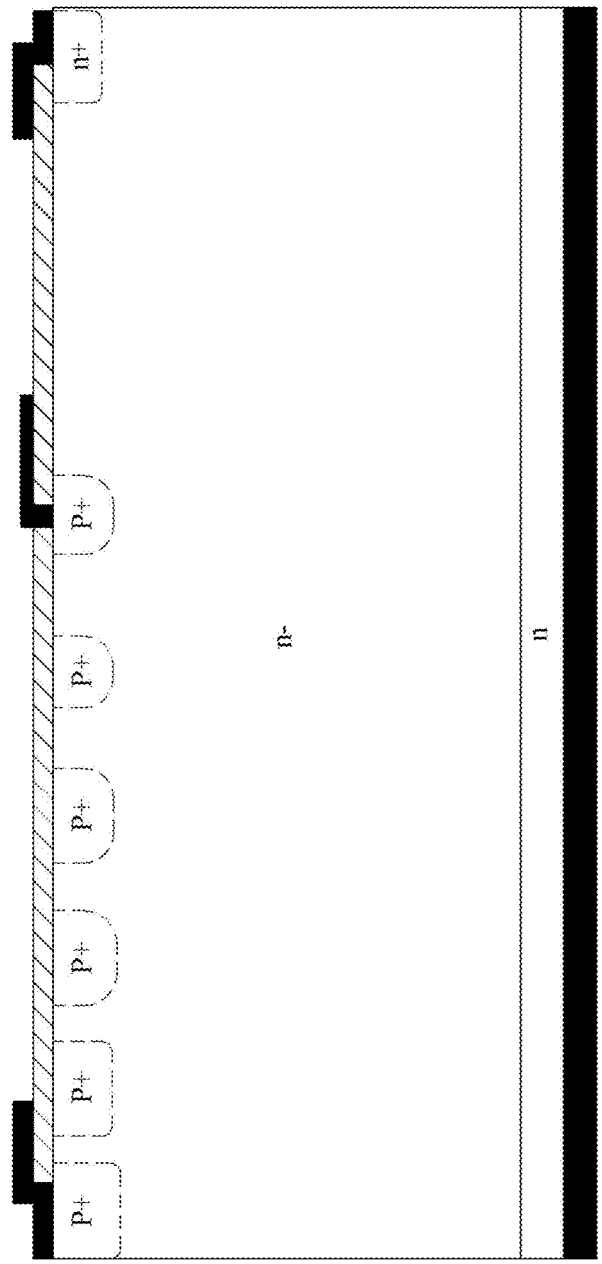
FIG. 1A is a schematic illustration showing a conventional high voltage edge termination structure with field plate and floating guard rings.
Figure 1B:
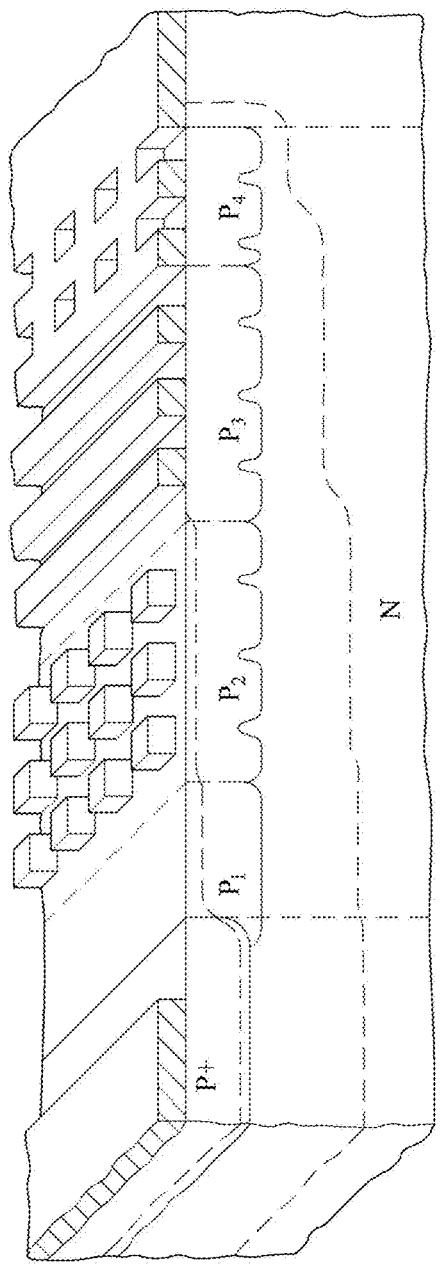
FIG. 1B is a schematic illustration showing a conventional high voltage edge termination structure of multi-zone junction termination extension (MZ-JTE) structure.

In the case of laterally modulated JTE structure shown in FIG. 1B, the multiple-zone P-type JTE regions require a finer lithography capability which many power device fabs may not have. As a result, the JTE structure with the multiple-zone P-type JTE regions may needs a larger or a supplement area for implementation. In contrast, the present embodiment utilizes a single P-JTE mask to establish uniformity in the deeper portion of the P-type JTE region and a modulation mask with varying implant window openings to counter dope the P-type JTE region. The varying window openings enable compensation of the upper portion of the P-type JTE region to spread depletion around the surface region so as to improve surface charge tolerance of JTE structure. The high voltage edge termination structure provided in accordance with the embodiments of the present invention may increase tolerance to surface charge variation with minimal increase in area for implementation.

Although embodiments of the present invention are discussed above primarily with respect to silicon semiconductor devices, embodiments of the present invention are not limited thereto. For example, the high voltage edge termination structures in accordance with some embodiments of the present invention may be formed on the semiconductor body of silicon carbide (SiC), gallium nitride (GaN) or gallium arsenide (GaAs) without departing from the scope of the present invention.

Although embodiments of the present invention are discussed above primarily with respect to a power diode, embodiments of the present invention are not limited thereto. For example, the high voltage edge termination structures in accordance with some embodiments of the present invention may be applied to the semiconductor device with a MOSFET structure, the semiconductor device with an IGBT structure, or the semiconductor device with a thyristor type structure without departing from the scope of the present invention.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A high voltage edge termination structure for a power semiconductor device, comprising:
    a semiconductor body of a first conductive type;
    a junction termination extension (JTE) region of a second conductive type formed in the semiconductor body, wherein the JTE region is adjacent to an active region of the power semiconductor device,
    wherein the JTE is adjacent to a well of the second conductive type of the active region, and the well is electrically connected to an anode electrode through a heavily doped region of the second conductive type;
    a heavily doped channel stop region of the first conductive type formed in the semiconductor body, wherein the heavily doped channel stop region is spaced apart from the JTE region;
    a plurality of depletable guard rings of the second conductive type, formed in the semiconductor body, wherein the plurality of depletable guard rings is formed between the JTE region and the heavily doped channel stop region; and
    a plurality of lightly doped regions of the second conductive type formed in an upper portion of the JTE region and at least one of the plurality of depletable guard rings;
    wherein a first distance is defined between each lightly doped region and a bottom surface of the JTE region, and a second distance is defined between each lightly doped region and a bottom surface of the at least one of the plurality of depletable guard rings.

2. The high voltage edge termination structure of claim 1, wherein the first conductivity type is N-type, and the second conductivity type is P-type.

3. A method of manufacturing the high voltage edge termination structure as claimed in claim 1, comprising:
    forming the heavily doped channel stop region of the first conductive type in the semiconductor body of the first conductive type by ion implantation of the first conductive type;
    forming the JTE region of the second conductive type in the semiconductor body by ion implantation of the second conductive type, wherein the JTE region is adjacent to the active region of the power semiconductor device and is spaced apart from the heavily doped channel stop region; and
    forming the plurality of depletable guard rings of the second conductive type in the semiconductor body by ion implantation of the second conductive type, wherein the plurality of depletable guard rings is formed between the JTE region and the heavily doped channel stop region;
    forming the plurality of lightly doped regions of the second conductive type formed in the upper portion of the JTE region and the at least one of the plurality of depletable guard rings.

4. The method of claim 3, wherein the JTE region and the plurality of depletable guard rings is simultaneously formed in the semiconductor body.

* * * * *